United States Patent
Fujito et al.

(10) Patent No.: US 7,957,195 B2
(45) Date of Patent: Jun. 7, 2011

(54) SEMICONDUCTOR DEVICE

(75) Inventors: Masamichi Fujito, Tokyo (JP); Makoto Mizuno, Tokyo (JP); Takahiro Yokoyama, Tokyo (JP); Kenji Kawada, Tokyo (JP); Takashi Iwase, Tokyo (JP); Yasunobu Aoki, Tokyo (JP); Takashi Kurafuji, Tokyo (JP); Tomohiro Uchiyama, Kodaira (JP); Shuichi Sato, Kodaira (JP); Yuji Uji, Tokyo (JP)

(73) Assignee: Renesas Electronics Corporation, Kawasaki (JP)

( * ) Notice: Subject to any disclaimer, the term of this patent is extended or adjusted under 35 U.S.C. 154(b) by 0 days.

(21) Appl. No.: 12/630,295

(22) Filed: Dec. 3, 2009

(65) Prior Publication Data

US 2010/0080058 A1     Apr. 1, 2010

Related U.S. Application Data

(63) Continuation of application No. 11/869,144, filed on Oct. 9, 2007, now Pat. No. 7,646,642.

(30) Foreign Application Priority Data

Oct. 11, 2006 (JP) .................................. 2006-277110
Sep. 10, 2007 (JP) .................................. 2007-233738

(51) Int. Cl.
 *G11C 16/00* (2006.01)
(52) U.S. Cl. .......... 365/185.18; 365/185.05; 365/185.21
(58) Field of Classification Search .................. None
 See application file for complete search history.

(56) References Cited

U.S. PATENT DOCUMENTS

| | | | | |
|---|---|---|---|---|
| 4,586,171 | A * | 4/1986 | Fujishima | 365/63 |
| 4,992,981 | A * | 2/1991 | Ganssloser et al. | 365/154 |
| 6,166,938 | A | 12/2000 | Wong | |
| 6,266,278 | B1 * | 7/2001 | Harari et al. | 365/185.18 |
| 6,317,349 | B1 | 11/2001 | Wong | |
| 6,317,364 | B1 | 11/2001 | Guterman et al. | |
| 6,449,204 | B1 | 9/2002 | Arimoto et al. | |
| 6,563,736 | B2 | 5/2003 | Hsu et al. | |
| 6,587,380 | B2 | 7/2003 | Kanai et al. | |
| 6,757,197 | B2 * | 6/2004 | Kamei | 365/185.23 |
| 7,471,560 | B2 * | 12/2008 | Yater et al. | 365/185.03 |
| 2003/0117842 | A1 | 6/2003 | Hanzawa et al. | |

FOREIGN PATENT DOCUMENTS

| | | |
|---|---|---|
| JP | 1-263997 | 10/1989 |
| JP | 10-146049 | 5/1998 |
| JP | 2001-178122 | 6/2001 |
| JP | 2004-319007 | 11/2004 |

* cited by examiner

*Primary Examiner* — Tan T. Nguyen
(74) *Attorney, Agent, or Firm* — Mattingly & Malur, PC

(57) ABSTRACT

The semiconductor device includes a nonvolatile memory, having a memory array containing 1-bit twin cells, each composed of electrically rewritable first and second storage devices, the first and second storage devices holding binary data according to difference of their threshold voltages, and having different retention characteristics depending on difference of the binary data thereof; a read circuit for differentially amplifying complementary data output from the first and second storage devices of the twin cell selected for read, and judging information stored in the twin cell; and a control circuit. Two memory cells constituting a twin cell are arranged to hold different data. Therefore, even when the retention performance of one memory cell deteriorates, the difference between data held by the two memory cells can be maintained. Hence, differential amplification of such difference enables acquisition of proper stored information. Thus, retention performance of an electrically rewritable nonvolatile memory cell is improved.

7 Claims, 15 Drawing Sheets

FIG. 3

A
(a) SPLIT-GATE TYPE FLASH MEMORY DEVICE AND EXAMPLES OF REWRITE BIASES

|  | BL | CG | MG | SL | WELL | |
|---|---|---|---|---|---|---|
| Read | 1.5V | 1.5V | 0V | 0V | 0V | |
| Raise Vth | 0V | 1.5V | 10V | 6V | 0V | (in bits) |
| Lower Vth | Hi-Z | 1.5V | -10V | 6V | 0V | (in one step) |

B
(b) STACKED-GATE FLASH MEMORY DEVICE (WRITE BY HOT CARRIERS) AND EXAMPLES OF REWRITE BIASES

|  | BL | WL | SL | WELL | |
|---|---|---|---|---|---|
| Read | 1.5V | 1.5V | 0V | 0V | |
| Raise Vth | 6V | 10V | 0V | 0V | (in bits) |
| Lower Vth | 10V | -10V | 10V | 10V | (in one step) |

C
(c) STACKED-GATE FLASH MEMORY DEVICE (WRITE BY FN TUNNEL) AND EXAMPLES OF REWRITE BIASES

|  | BL | WL | SL | WELL | |
|---|---|---|---|---|---|
| Read | 1.5V | 1.5V | 0V | 0V | |
| Raise Vth | -10V | 10V | -10V | -10V | (in one step) |
| Lower Vth | 10V | -10V | 0V | 0V | (in bits) |

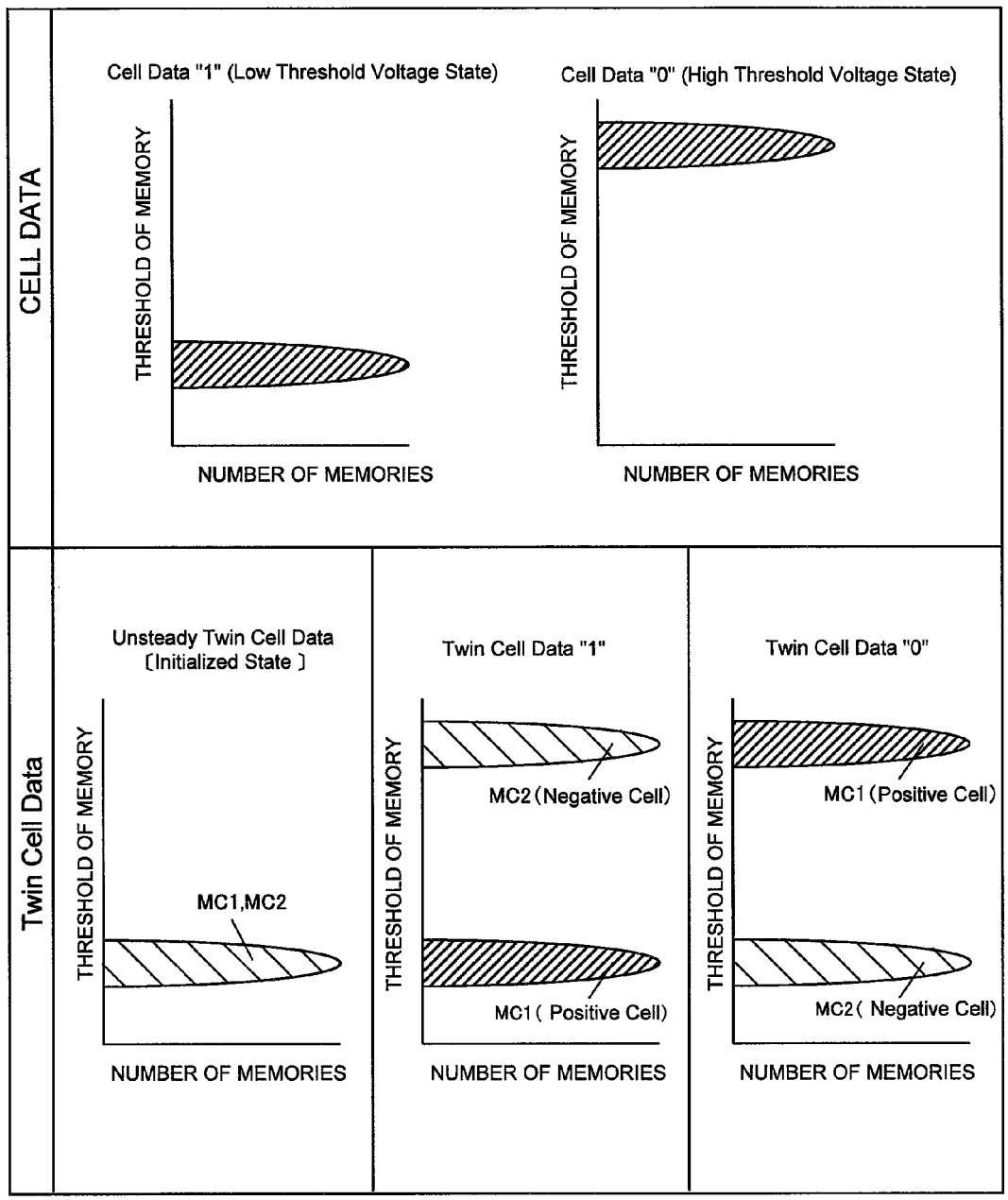

Before Data Write ⟹ After Data Write

Before Data Write ⟹ After Data Write

FIG. 10

|  | (B) Complementary Data Storing (FIG. 9) (Initial State: Closed to the Public) | (A) Complementary Data Storing (FIG. 7) (Initial State: Open) |
|---|---|---|
| Erase | Not included | Not included |
| Initialize (Unfixed Read Value) | Not included | ICMD<br>1. Write 20H at a flash address<br>2. Write D0H at an initialize block address |
| Write | PECMD<br>1. Write E8H at a flash address<br>2. Put write data at a write address<br>... | PCMD<br>1. Write E8H at a flash address<br>2. Put write data at a write address<br>... |
| Blank Check | Not included | BCMD<br>1. Write 71H at a flash address<br>2. Write D0H at an initialize block address |

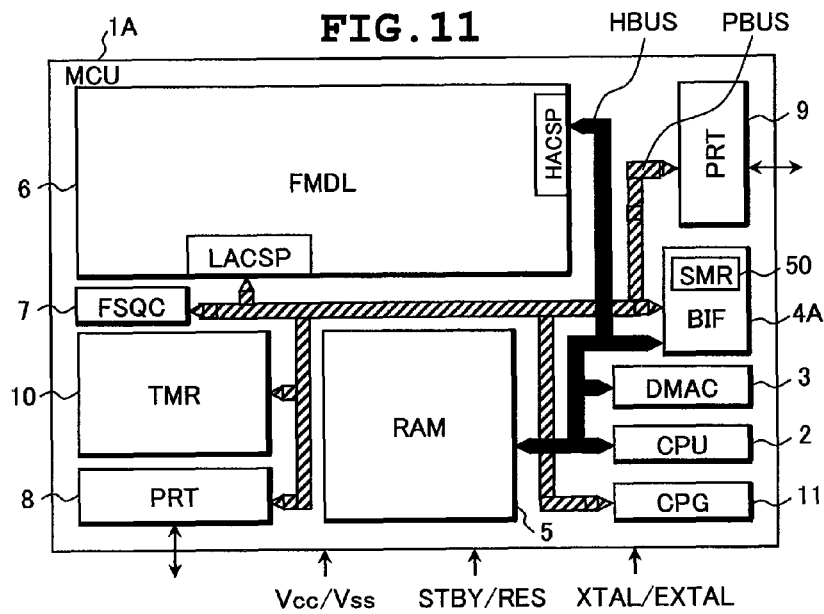

FIG. 11

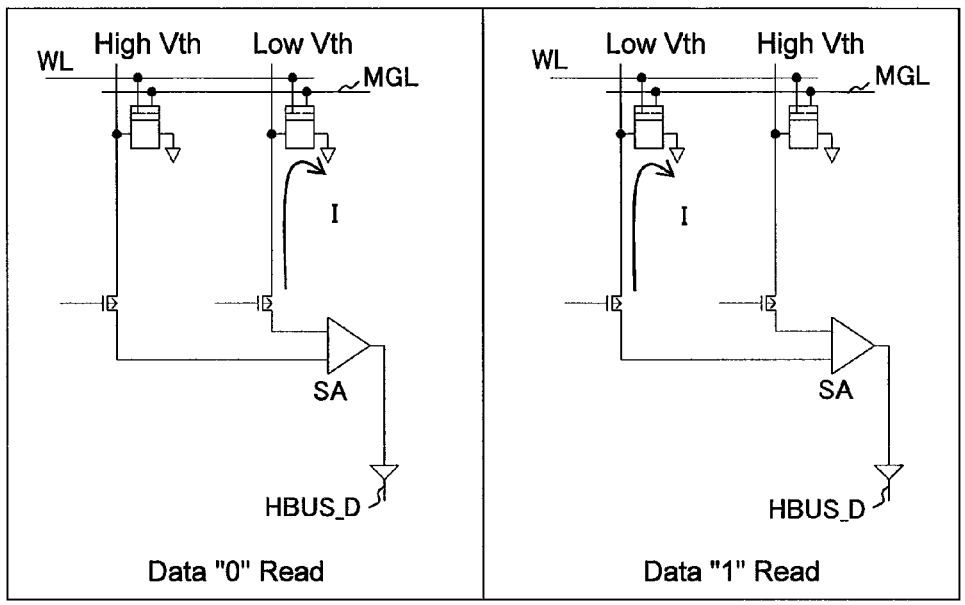

| Secure Mode Register | Flash Memory Address | Bus Request to Flash Memory | Access Form to Flash Memory | Peripheral bus ->High-speed bus Data carrier change |
|---|---|---|---|---|
| 0 (Non-secure Mode) | Address MAP First Half | high-speed bus (HACSP) | Read *1 | Not Made |
| 0 (Non-secure Mode) | Address MAP Latter half | Peripheral Bus (LACSP) | Read *2 | Made |
| 0 (Non-secure Mode) | Address MAP Whole | Peripheral Bus (LACSP) | Write *3 | Made |
| 1 (Secure Mode) | Address MAP Whole | high-speed bus (HACSP) | Read *4 | Not Made |
| 1 (Secure Mode) | Address MAP Whole | Peripheral Bus (LACSP) | Write *5 | Made |

*1 : High-speed Read (Complementary Read)
*2 : Low-power Read (1 memory cell/bit Read)
*3 : Normal Write
*4 : Secure Read (Complementary Read)
*5 : Secure Write (Complementary Data Write Only)

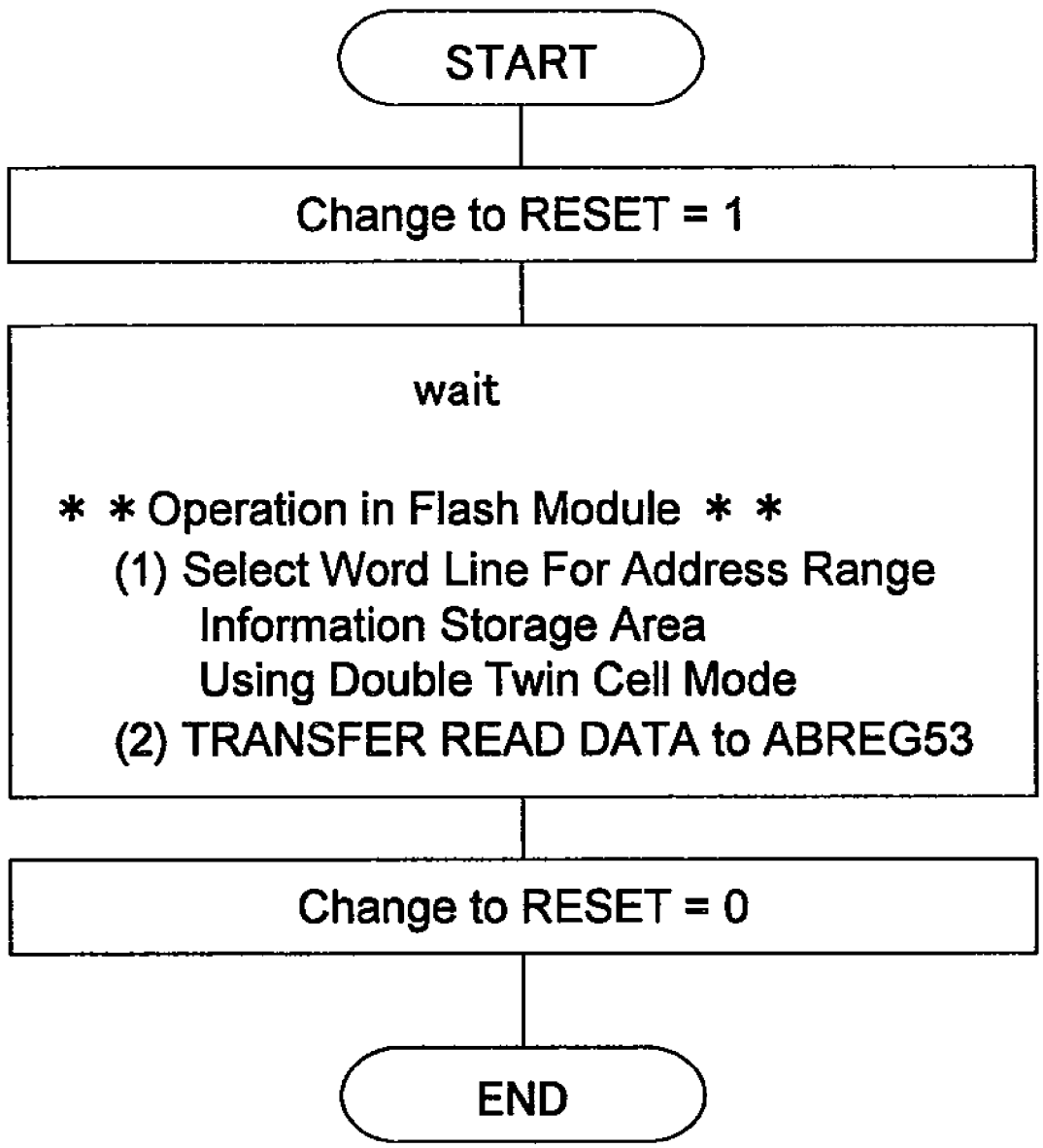

SEMICONDUCTOR DEVICE

CROSS-REFERENCES

This is a continuation application of U.S. Ser. No. 11/869,144, filed Oct. 9, 2007, now U.S. Pat. No. 7,646,642 the content of which is hereby incorporated by reference.

CLAIM OF PRIORITY

The Present application claims priority from Japanese applications JP 2006-277110 filed on Oct. 11, 2006, and JP 2007-233738 filed on Sep. 10, 2007, the contents of which are hereby incorporated by reference into this application.

FIELD OF THE INVENTION

The present invention relates to a read form of a rewritable nonvolatile storage device which caters to system requirements including the improvement of its retention characteristic, stored information property, read speed, and power consumption. Further, it relates to a technique useful in an application to a microcomputer equipped with a nonvolatile memory using a pair of rewritable storage devices as a 1-bit twin cell.

BACKGROUND OF THE INVENTION

JP-A-1-263997 discloses a technique for make more strict judgment criterion for verify in comparison to those in the cases of typical read operations for a nonvolatile semiconductor memory, in which complementary data are written in a pair of memory cells, a potential difference between paired bit lines produced by data read out from the pair of memory cells is amplified by a differential sense amplifier, and then the resultant readout data is judged. In addition, JP-A-2004-319007 discloses a multivalued storage technique by which data of quaternary or more are held in a pair cell constituted by a pair of nonvolatile memory cells.

SUMMARY OF THE INVENTION

The inventor has made an analysis on the retention characteristics for electrically rewritable nonvolatile memory cells. For instance, one of the themes is the influence of an ambient temperature on the retention characteristics. Specifically, as for a flash memory cell having a split-gate structure that a select gate and a memory gate are separated, the threshold voltage of a memory cell (high-threshold voltage memory cell) holding data "0" lowers with time under a temperature of e.g. 160° C., whereas the threshold voltage of a memory cell holding data "1" is not changed so much. On the other hand, under an atmospheric temperature a memory cell (low-threshold voltage memory cell) holding data "1" has a threshold voltage increasing with time, whereas the threshold voltage of a memory cell holding data "0" is not changed significantly. This tendency is also observed in the case of a flash memory cell of a stacked-gate structure.

A study has been made on these phenomena, and the following results could be gained. First, in the current situation a method of using one memory cell to store one bit of data suffices. However, in the cases where such device is used at a high temperature, and the downsizing of memory cells, etc. advances further, it is foreseen that the guarantee of a data retention performance would be more difficult in the future. Then, it is considered that the adoption of a twin cell method using two memory cells for storing one bit of data enables such guarantee. As the twin cell method, the following two form are possible: a form in which uniform data are held in two memory cells; and a form in which different data are held in two memory cells. For instance, in the case of usage under a high temperature, use of the former form deteriorates the characteristics of data "0". In the case of usage under an atmospheric temperature, the characteristics of data "1" worsen. In contrast, in the case of the latter form, it is found that the deterioration of the characteristics is smaller in any cases.

for the conventional flash memories, it is generally hard to make a rewrite access (including a write operation and an erase operation) to data randomly in bits or bytes, because it is easy to make write access in bits or bytes but it is hard to make erase access in bits or bytes. Information is written by making uniform threshold voltages of nonvolatile memory cells in units for erase while becoming them lower into a lower voltage range as erasing data stored in the memory cells for initialization, selectively becoming the threshold voltages of the memory cells higher into a higher voltage range according to write data as writing data of information. In other words, the threshold voltage of the memory cell becomes higher in response to storing logical "0" data, the threshold voltage of the memory cell still remains lower in response to storing logical "1" data.

The other hands, as for the complementary data storing flash memory, the threshold voltage of one memory cell of twin cell has already become higher after data writing regardless the data being logical "0" or "1". Therefore, in writing information into a twin cell, the following two actions must be performed regardless of whether the logical value of write data is 1 or 0: erasing both two memory cells of the twin cell; and selectively writing data into one memory cell of the twin cell (the threshold voltage of different one memory cell of the twin cell becomes higher in accordance with the logical value of data). As a result in responding to a command to write data, a process to respond the data write command cannot be completed until an operation time for an erasing action has elapsed, and therefore the time required to write data is made longer than the case of the conventional flash memory apparently.

Further, the inventor found that the usage forms of twin cells are useful for not only improvement of retention characteristics but also for realizing read forms which can cater for system requirements such as the confidentiality of stored information, a read speed, and power consumption.

It is an object of the invention to increase the retention characteristics of electrically rewritable nonvolatile memory cells.

It is another object of the invention to shorten apparent data write time for a nonvolatile memory using two rewritable storage devices as a twin cell of one bit.

Further it is an object of the invention to provide a semiconductor device which can adapt to a usage form such that it is hard to estimate information stored in a nonvolatile memory by observation of operating current.

Still further, it is an object of the invention to provide a semiconductor device which allows us to select read forms according to system requirements such as a read speed with respect to a nonvolatile memory, and power consumption.

The above and other objects and novel features of the invention will be apparent from the descriptions hereof and the accompanying drawings.

The outlines of the typical forms according to the invention disclosed herein will be described below.

[1] A semiconductor device according to an embodiment of the invention has a nonvolatile memory, including a memory array (19). The memory array has: a plurality of 1-bit twin cells, each composed of an electrically rewritable first storage device (MC1) and an electrically rewritable second storage device (MC2), the first and second storage devices holding binary data according to difference of their threshold voltages, and having different retention characteristics depending on difference of the binary data held by themselves; a read circuit (SA) for differentially amplifying complementary data output from the first and second storage devices of the twin cell selected for read, and judging information stored in the twin cell; and a control circuit (7). The control circuit performs initialization control including a step of making uniform threshold voltages of the first and second storage devices of the twin cells into an initialization level in initialization units, and write control including a step of changing the threshold voltage of one of the first and second storage devices of the twin cell selected for write from the initialization level, and a step of writing the complementary data into the twin cell.

As described above, memory cells have a feature that when the cells have different binary data, their retention characteristics differ. In the semiconductor device according to the invention, two memory cells constituting a twin cell are arranged to hold different data. Therefore, even when the retention performance of one memory cell deteriorates, the difference between data held by the two memory cells can be maintained. Hence, differential amplification of such difference enables acquisition of proper stored information.

As one specific form according to the invention, the control circuit responds to an initialize command (ICMD) supplied from the outside of the nonvolatile memory, and performs the initialization control on the initialization unit specified by an initialization address. Also, the control circuit responds to a write command (PCMD) supplied from the outside to the nonvolatile memory, and performs the write control including a step of writing the complementary data specified by write data into the twin cell specified by a write address. In the initialization state (initial state) where threshold voltages of the first and second memory cells of the twin cell are made uniform into an initialization level, the stored information of twin cell is unsteady. The control form is significant in that the unsteady state of stored information is made open to a user (that state is shown to a user). Hence, the data write control includes no initialization control, and shortening of the data write time is apparently achieved.

In the initial state, stored information of the twin cell is unsteady, and therefore it is possible to read any of logical values "1" and "0". At this time, the control circuit responds to an initialization check command (BCMD) supplied from the outside of the nonvolatile memory, and performs check control. According to the check control, the result of judgment about whether the twin cell as an initialization unit specified by a check address is in the initialization state or not is returned as a command replay. Thus, whether or not the twin cell is in the initial state can be confirmed from the outside.

As another specific form according to the invention, a control form that the initial state may be hidden from a user can be adopted. That is, the control circuit responds to a write command (PECMD) supplied from outside of the nonvolatile memory, performs the initialization control on the twin cell of the initialization unit specified by a write address, and then performs the write control including a step of writing complementary data specified by the write data into the twin cell specified by the write address. When this control form is adopted, the state where the stored information of the twin cell is unsteady cannot be seen by a user.

[2] The semiconductor integrated circuit according to the invention, which is specifically designed focusing on putting the initial state on view to a user, has a nonvolatile memory including: a memory array having a plurality of 1-bit twin cells, each composed of rewritable nonvolatile first and second storage devices; a read circuit for differentially amplifying complementary data output from the twin cell selected for read; and a control circuit. The control circuit responds to a direction of initialization given from outside of the nonvolatile memory, and controls an initialize operation including a step of making uniform data held by first and second storage devices of the twin cell specified by an initialization address. The control circuit responds to a direction for write supplied from the outside of the nonvolatile memory, and controls a write operation including a step of changing data held by one of the first and second storage devices of the twin cell specified by a write address and writing complementary data into the twin cell.

According to the above-described form, two memory cells constituting a twin cell are arranged to hold different data. Therefore, even when the retention performance of one memory cell deteriorates, the difference between data held by the two memory cells can be maintained. Hence, differential amplification of such difference enables acquisition of proper stored information. In the initialization state (initial state), data held by the first and second memory cells of the twin cell are made uniform, the stored information of the twin cell is unsteady, however the state where the unsteady state of stored information is made open to a user. Hence, the data write control includes no initialization control, and shortening of the data write time is apparently achieved.

In the initial state, stored information of the twin cell is unsteady, and therefore it is possible to read any of logical values "1" and "0". At this time, the control circuit responds to an initialization check command supplied from the outside of the nonvolatile memory, and performs check control. According to the check control, the result of judgment about whether or not first and second storage devices of the twin cell as an initialization unit specified by a check address hold identical data is returned as a command replay. Thus, whether or not the twin cell is in the initial state can be confirmed from the outside.

As one specific form according to the invention, the semiconductor integrated circuit further includes: write data latch circuits utilized to hold complementary data to be written into the twin cell; and verify circuits for comparing data read out from the twin cell with data held by the data latch circuits and making a judgment. The check control by the control circuit includes a step of forcing the write data latch circuits to hold uniform data in response to the direction for checking initialization, and a step of using, as the identification information, results of comparison and judgment by the verify circuit about whether or not data read out from the twin cell of an initialization unit specified by a check address agrees with data held by the data latch circuits. According to the form, the increase in the scale of the circuit to make a judgment about whether or not the twin cell is in the initial state can be suppressed.

[3] The semiconductor integrated circuit according to the invention, which is specifically designed focusing on leaving the initial state invisible, has a nonvolatile memory including: a memory array having a plurality of 1-bit twin cells, each composed of rewritable nonvolatile first and second storage devices; a read circuit for differentially amplifying complementary data output from the twin cell selected for read; and a control circuit. The control circuit responds a direction for write given from outside of the nonvolatile memory, and controls a write operation including a step of making uniform data held by first and second storage devices of the twin cell specified by a write address, a step of changing data held by appropriate one of the first and second storage devices according to write data, and a step of writing complementary data into the appropriate twin cell data according to the write data.

According to the above-described form, two memory cells constituting a twin cell are arranged to hold different data. Therefore, even when the retention performance of one memory cell deteriorates, the difference between data held by the two memory cells can be maintained. Hence, differential amplification of such difference enables acquisition of proper stored information. The state where the information stored in the twin cell is made unsteady is invisible to a user.

[4] As a further specific form according to the invention, the first and second storage devices are flash memory cells holding binary data according to difference of their threshold voltages, and having different retention characteristics depending on difference of binary data held by themselves.

Between bit lines respectively connected with the first and second storage devices constituting one of the plurality of twin cells, is arranged other bit line connected with the first or second storage device of other twin cell.

The other bit line serves as a shield line for relaxing the influence of capacitive coupling on complementary level changes of bit lines located both sides of the other bit line.

Select terminals of the first and second storage devices constituting a twin cell are connected with a common word line (WL). This form facilitates selecting the twin cells.

The semiconductor integrated circuit further includes: a first data latch circuit (LTP) for latching write data supplied from the outside of the nonvolatile memory; a second data latch circuit (LTN) for latching inverted data of the write data; a first current switch for supplying a first bit line with a write current for changing a threshold voltage of the first storage device according to data held by the first latch circuit; and a second current switch for supplying a second bit line with a write current for changing a threshold voltage of the second storage device according to data held by the second latch circuit. This form makes it possible to write complementary data relatively with ease.

The semiconductor integrated circuit further includes: a first comparator circuit (EXOR_P) for comparing data output from the first storage device to the first bit line with data held by the first latch circuit; a second comparator circuit (EX-OR_N) for comparing data output from the selected second storage device to the second bit line with data held by the second latch circuit; and a judging circuit (AND) for judging whether or not a result of the comparison by the first comparator circuit agrees with a result of the comparison by the second comparator circuit. This form makes it possible to perform write verify, etc. relatively with ease.

[5] A semiconductor device (1A) according to the invention, which is designed focusing on a security measure in connection with stored information, has: a central processing unit (2); and a rewritable nonvolatile memory (6, 7) targeted for access by the central processing unit. The nonvolatile memory includes a memory array (19), and a plurality of electrically rewritable nonvolatile storage devices (MC1, MC2), each having a select terminal connected with a select control line, and a data terminal connected with a data line, in which one pair of the storage devices sharing the select control line can form a twin cell; a first read circuit (SA) for differentially amplifying complementary data read out to different data lines from a pair of storage devices of the twin cell selected by the select control line, a second read circuit (VSA, VS_P, VSA_N) for amplifying data read out from one storage device of the selected twin cell, a write control circuit (7), and an external interface circuit (HACSP, LACSP). The write control circuit has a write mode for forcing a pair of storage devices of the selected twin cell to hold non-inverted data and inverted data of write data of one bit. The external interface circuit has a first read mode for outputting data resulting from differential amplification of non-inverted data and inverted data read out from a pair of storage devices of the selected twin cell by the first read circuit to outside, and a second read mode for outputting data resulting from amplification of data read out from one storage device of the selected twin cell by the second read circuit to the outside. Thus, in the first read mode, the operating current is unchanged regardless of a value of read data, which can make difficult data estimation by current observation.

As one specific form according to the invention, the external interface circuit may have a first external interface circuit (HACSP) performing a read operation in the first read mode, and a second external interface circuit (LACSP) performing a read operation in the second read mode independently. Differential amplification in the first read mode enables high-speed reading. Further, single-end amplification in the second read mode enables reading with low power consumption in spite of a low speed. In this case, to individually connect buses with one of the interface circuits which the buses can conform to, it is preferable to individuate the first and second external interface circuits.

Further, as one specific form according to the invention, the semiconductor integrated circuit includes: a first bus (HBUS) connected with the first external interface circuit; a second bus (PBUS) connected with the second external interface circuit; and a bus interface circuit (4A) connected with the first and second buses. The first bus is connected with the central processing unit. When responding to a request for read access from the central processing unit, the bus interface circuit assigns the first read mode for the first external interface circuit or the second read mode for the second external interface circuit according to an address targeted for the access. Thus, control for switching access to individuated first and second external interface circuits can be materialized relatively with ease.

As one specific form according to the invention, when responding to a request for read access from the central processing unit, the bus interface circuit assigns the first read mode for the first external interface circuit or the second read mode for the second external interface circuit according to an address targeted for the access if a mode register (50) is in a first state, and assigns the first read mode for the first external interface circuit regardless of the address targeted for the access if the mode register is in a second state. Thus, the control which enables reinforcement of security can be achieved using a bus interface circuit relatively with ease.

The semiconductor device according to the invention, which is specifically designed focusing on a security measure for stored information, has a central processing unit and a nonvolatile memory as in the case of the above-described device. The nonvolatile memory includes a memory array, a first read circuit, a second read circuit, a write control circuit and an external interface circuit. In this case, the external interface circuit has a secure read mode for outputting data resulting from differential amplification of non-inverted data and inverted data read out from a pair of storage devices of the selected twin cell by the first read circuit to outside, and a non-secure read mode for outputting data resulting from amplification of data read out from one storage device of the selected twin cell by the second read circuit to the outside.

[6] A semiconductor device (1B) according to the invention, which is specifically designed focusing on selective speed-up of a read operation, includes: a central processing unit (2); and a electrically rewritable nonvolatile memory (6A, 7) which can be accessed by the central processing unit. The nonvolatile memory includes a memory array (19), and a plurality of electrically rewritable nonvolatile storage devices (MC1, MC2) each having a select terminal connected with a select control line and a data terminal connected with a data line, in which one pair of the storage devices sharing the select control line can form a twin cell, a select control line selecting circuit (24A, 25A) for selecting the select control line based on an address signal, a data line selecting circuit (30, 22) for selecting the data line based on the address signal, a first read circuit (SA) for differentially amplifying complementary data read out to the different data lines from a pair of storage devices of the twin cell selected by the select control line selecting circuit and data line selecting circuit, a write control circuit, and a select control circuit. The write control circuit has a write mode for forcing a pair of storage devices of the selected twin cell to hold non-inverted data and inverted data of write data of one bit. The select control circuit controls a number of select control lines selected for the storage devices sharing the data line selected by the data line selecting circuit. Thus, when a plurality of select control lines are selected for storage devices sharing a data line, the quantity of signals supplied to the data line is increased in comparison to the case of selecting one select control line, and therefore the read operation can be speeded up accordingly.

As one specific form according to the invention, the first read circuit performs a first read operation for differentially amplifying and outputting non-inverted data and inverted data read out to a pair of selected data lines from a pair of storage devices of the twin cell selected with the select control line, or a second read operation for differentially amplifying and outputting non-inverted data and inverted data read out to the pair of data lines from a pair of storage devices of each of the twin cells selected with the select control lines and sharing a pair of data lines.

As one specific form according to the invention, the select control circuit has a mode register (51) for deciding whether to select one select control line or more select control lines. In this case, switching between the first read operation and the second read operation can be performed easily.

As one specific form according to the invention, the select control circuit further includes an address judging circuit (53, 54) for judging an address when a plural number of the select control lines are selected, when it is directed by the mode register to select a plural number of the select control lines, a plural number of the select control lines are selected only for an address range judged by the address judging circuit. It is possible to selectively control the second read operation on a certain address range.

As one specific form according to the invention, the address judging circuit further includes an address register (53) whose address range targeted for selecting a plural number of the select control lines is set to be rewritable. The address range that the second read operation can be selected is variable.

As one specific form according to the invention, the semiconductor device further includes a second read circuit (VSA, VSA_P, VSA_N) for performing a third read operation for amplifying and outputting data read out from one storage device of the selected twin cell. In spite of a slow read operation, it becomes possible to cater to the demand for reduction in power consumption.

As one specific form according to the invention, the semiconductor device further includes: a first external interface circuit (HACSP) for outputting data gained by the first and second read operations to the outside; and a second external interface circuit (LACSP) for outputting data gained by the third read operation to the outside. High-speed data reading is enabled according to the first or second read operation utilizing differential amplification. Further, the third read operation according to the single-end amplification enables data reading with a reduced power consumption in spite of a low speed. In this case, to individually connect buses with one of the interface circuits which the buses can conform to, it is preferable to individuate the first and second external interface circuits.

As one specific form according to the invention, the semiconductor device further includes: a first bus (HBUS) connected with the first external interface circuit; a second bus (PBUS) connected with the second external interface circuit; and a bus interface circuit connected with the first and second buses. The first bus is connected with the central processing unit, and when responding to a request for read access from the central processing unit, the bus interface circuit directs the first or second external interface circuit to perform the read operation according to an address targeted for the access. Thus, the control for switching access to individuated first and second external interface circuits can be materialized relatively with ease.

BRIEF DESCRIPTION OF THE DRAWINGS

FIGS. 3A-3C are illustrations exemplifying the structures and operation voltage conditions of memory cells;

FIG. 4 is an illustration showing a form of a twin cell composed of nonvolatile memory cells;

FIG. 10 is a table for explaining and exemplifying commands used in the case of controlling data states as shown in FIGS. 7 and 9;

FIG. 11 is a block diagram showing a second microcomputer (MCU) 1A according to an embodiment of the invention;

FIG. 12 is a schematic circuit diagram showing read forms for data "0" read and data "1" read in a secure mode;

FIG. 14 is a table for explaining and exemplifying access forms to a flash memory by a bus interface circuit;

FIG. 23 is a flow chart showing a control flow of reset transmission of address range information.

DETAILED DESCRIPTION OF THE PREFERRED EMBODIMENTS

First Microcomputer

Figure 2:
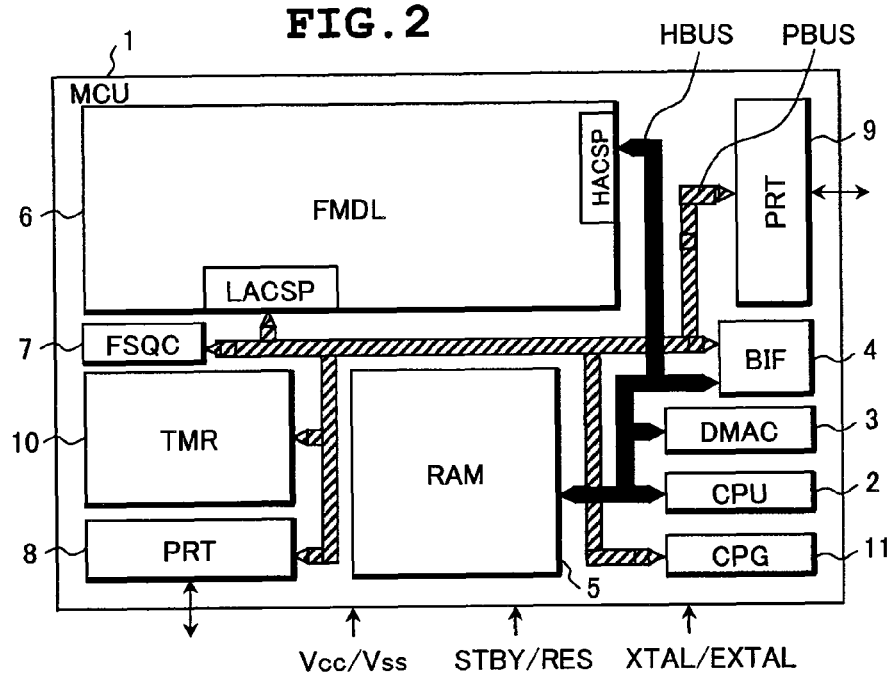
FIG. 2 is a block diagram exemplifying a microcomputer according to an embodiment of the invention.

FIG. 2 shows a microcomputer (MCU) 1 according to an embodiment of the invention. The microcomputer 1 shown in the drawing is formed on a chip of semiconductor such as monocrystalline silicon, for example, by a complementary MOS IC manufacturing technique.

The microcomputer 1 is not particularly limited, but it has a two-bus structure having a high-speed bus HBUS and a peripheral bus PBUS. The high-speed bus HBUS and peripheral bus PBUS are not particularly limited, but they each include a data bus, an address bus and a control bus. Separation of buses into the two types of buses is intended to make the load to a bus smaller in comparison to the case where all the circuits are connected with a common bus in common, thereby to ensure a high-speed access operation.

To the high-speed bus HBUS are connected: a central processing unit (CPU) 2, which has an instruction control section and an execution section and executes an instruction; a direct memory access controller (DMAC) 3; a bus interface circuit (BIF) 4 which controls performs bus interface control or bus bridge control of the high-speed bus HBUS and the peripheral bus PBUS; a random access memory (RAM) 5 used for a work area of the central processing unit 2, etc.; and a flash memory module (FMDL) 6 as a nonvolatile memory module for storing data and a program.

To the peripheral bus PBUS are connected: a flash sequencer (FSQC) 7, which performs command access control on the flash memory module (FMDL) 6; external I/O ports (PRT) 8 and 9; a timer (TMR) 10; and a clock pulse generator (CPG) 11 which generates an internal clock signal of the microcomputer. The reference characters XTAL and EXTAL denote a clock terminal to which an oscillator is connected and a clock terminal to which an external clock signal is supplied, respectively. STBY denotes an external hardware standby terminal for specifying a standby state. RES denotes an external reset terminal for specifying a reset operation. Vcc denotes an external source terminal. Vss denotes an external ground terminal.

Herein, the flash sequencer 7 as a logic circuit is designed based on logical synthesis, and the flash memory module 6 having an array structure is designed using a CAD tool. Therefore they are shown as discrete circuit blocks in the drawing for the sake of convenience, however they constitute a flash memory. The flash memory module 6 is connected with the high-speed bus HBUS through a high-speed access port (HACSP) dedicated to read purposes. The CPU and DMAC can make a read access to the flash memory module 6 through the high-speed access port over the high-speed bus HBUS. When making a write access and an initialization access to the flash memory module 6, the CPU 2 and DMAC 3 issue a command to the flash sequencer 7 through the bus interface 4 and peripheral bus PBUS. Then, the flash sequencer 7 performs initialization control of and write control to the flash memory module through the low-speed access port (LACSP) over the peripheral bus PBUS.

Flash Memory Module

Figure 1:
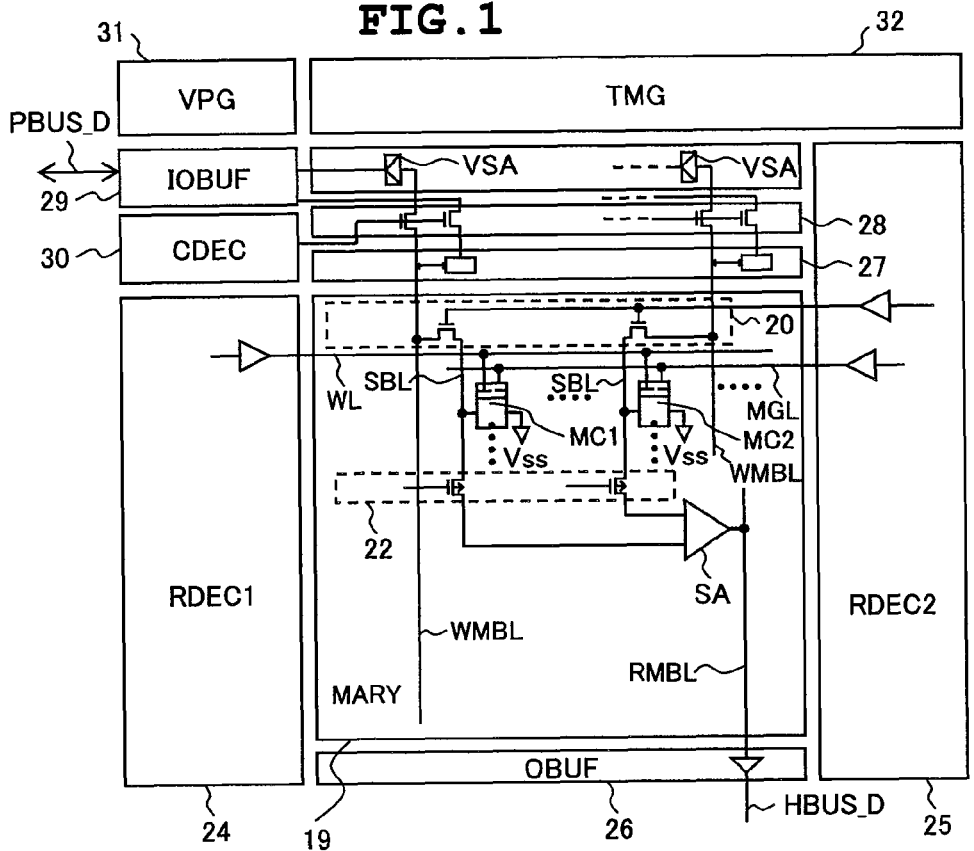
FIG. 1 is a block diagram exemplifying the structure of a flash memory module.

FIG. 1 shows the configuration of the flash memory module 6. The flash memory module 6 uses two nonvolatile memory cells to store one bit of information. That is, the memory array (MARY) 19 includes a plurality of 1-bit twin cells, each composed of a pair of rewritable and nonvolatile memory cells MC1 and MC2. In FIG. 1, only one pair is shown as a representative of the twin cells. The nonvolatile memory cells MC1 and MC2 make, for example, a split-gate type flash memory device exemplified in FIG. 3A. The memory device has: a control gate (CG) and a memory gate (MG), which are disposed over a channel region between source and drain regions with a gate isolation film interposed therebetween; and a charge trap region (SiN) of e.g. silicon nitride disposed between the memory gate and gate isolation film. The source or drain region on the select gate side is connected with a bit line (BL), and the source or drain region on the memory gate side is connected with a source line (SL). To lower the threshold voltage (Vth) of the memory cell, electrons are drawn from the charge trap region (SiN) to the well region (WELL) by a high electric field between the well region (WELL) and memory gate MG under the conditions of BL=Hi-Z (High impedance state), CG=1.5 V, MG=−10 V, SL=6 V, and WELL=0 V. The unit of this process is a plurality of memory cells sharing the memory gate. To raise the threshold voltage (Vth) of the memory cell, a write current is made to flow from the source line SL to the bit line under the conditions of BL=0 V, CG=1.5 V, MG=10 V, SL=6 V, and WELL=0 V. As a result, hot electrons generated in a portion of the boundary between the control gate and memory gate are poured into the charge trap region (SiN). As the pouring of electrons depends on whether or not to pass an electric current through the bit line, this process is controlled in bits. The action of read is performed under the conditions of BL=1.5 V, CG=1.5, MG=0V, SL=0 V, and WELL=0V. When the threshold voltage of the memory cell is lower, the memory cell is brought to ON state; when the threshold voltage is higher, the memory cell is brought to OFF state. The memory device is not limited to a split-gate type flash memory device, and it may be a stacked-gate flash memory device as exemplified in FIGS. 3B and 3C. This type of memory device has a floating gate (FG) and a control gate (WL), which are stacked over a channel region between source and drain regions with a gate isolation film located interposed the gates and channel region. In the example shown in FIG. 3B, the threshold voltage is raised by the hot carrier write technique, and lowered by release of electrons into the well region (WELL). In the example shown in FIG. 3C, the threshold voltage is raised by the FN tunnel write method, and lowered by release of electrons into the bit line (BL).

In storing information by a twin cell composed of nonvolatile memory cells MC1 and MC2, complementary data are put in the nonvolatile memory cells MC1 and MC2 as exemplified by the threshold voltage distributions shown in FIG. 4. That is, the memory cells MC1 and MC2 hold the cell data "1" (a low-threshold-voltage state) or the cell data "0" (a high-threshold-voltage state). In such condition, assuming that one memory cell MC1 of the twin cell forms a positive cell, and the other memory cell MC2 makes a negative cell, the state of twin cell data "1" is the one in which the positive cell MC1 holds the cell data "1", and the negative cell holds the cell data "0"; the state of twin cell data "0" is the one in which the positive cell MC1 holds the cell data "0", and the negative cell holds the cell data "1". The state where the positive cell MC1 and negative cell MC2 of the twin cell both hold cell data "1" is termed an initialize state, in which the twin cell data is unsteady.

In regard to the memory cells MC1 and MC2 of the twin cell representatively shown in FIG. 1, the memory gates MG are connected with a common memory gate select line MGL, and the control gates CG are connected with a common word line WL. In reality, many twin cells are arranged in a matrix form, and they are connected with corresponding memory gate select lines MGL and word lines WL in arrays extending in a row direction. The memory cells MC1 and MC2 are connected with corresponding sub bit lines SBL in columns of the twin cell matrix, and connected through respective sub bit line selectors 20 to corresponding used-for-write main bit lines WMBL. The individual used-for-write main bit lines WMBL are connected with sub bit lines SBL by the sub bit line selectors 20; the sub bit lines SBL are organized hierarchically. The unit of the memory cells organized hierarchically through the sub bit lines SBL is referred to as "memory mat". The source line SL of each memory cell is connected with a ground Vss. The sub bit line SBL of the memory cell MC1 is connected with one differential input terminal of a hierarchical sense amplifier SA through a read column selector 22 on an individual memory mat basis. The sub bit line SBL of the memory cell MC2 is connected with the other differential input terminal of the hierarchical sense amplifier SA through the read column selector 22 on an individual memory mat basis. The word line WL is selected by the first row decoder (RDEC1) 24. The memory gate line MGL and sub bit line selector 20 are selected by the second row decoder (RDEC2) 25. The select actions by the first and second row decoders 24 and 25 are performed according to address information, etc. supplied to the high-speed access port HACSP in read access, whereas in data write and initialization, such select actions are performed according to address information, etc. supplied to the low-speed access port LACSP. An output of the hierarchical sense amplifier SA is connected with the used-for-read main bit line RMBL and then connected through the output buffer (OBUF) 26 to the data bus HBUS_D of the high-speed bus HBUS. The number of used-for-read main bit lines RMBL provided actually may be, for example, a number corresponding to the parallel data input and output bit number of the output buffer 26. The used-for-write main bit line WMBL is arranged so that a write current is passed through it selectively according to latch data of the write data latch circuit 27. The write data latch circuit 27 is selected by the rewrite column selector 28. The used-for-rewrite main bit line WMBL selected by the rewrite column selector 28 is connected with the verify sense amplifier VSA. An output of the verify sense amplifier VSA and the write data latch circuit 27 are connected with the I/O circuit (IOBUS) 29 interfaced with a data bus (PBUS_D) of the peripheral bus PBUS. The rewrite column selector 28 is selected by the column decoder (CDEC) 30. The column decoder 30 makes selection according to address information etc. supplied to the low-speed access port LACSP. The power supply circuit (VPG) 31 generates operation power sources required for read, write and initialization. The timing generator (TMG) 32 generates an internal control signal for determining an internal operation timing according to an access strobe signal supplied to the high-speed access port HACSP from CPU 2, etc., and an access command, etc. supplied to the low-speed access port LACSP from the flash sequencer FSQC 7. The flash sequencer FSQC 7 and timing generator 32 constitute a control section of the flash memory.

Read of Twin Cell Data

Figure 5:
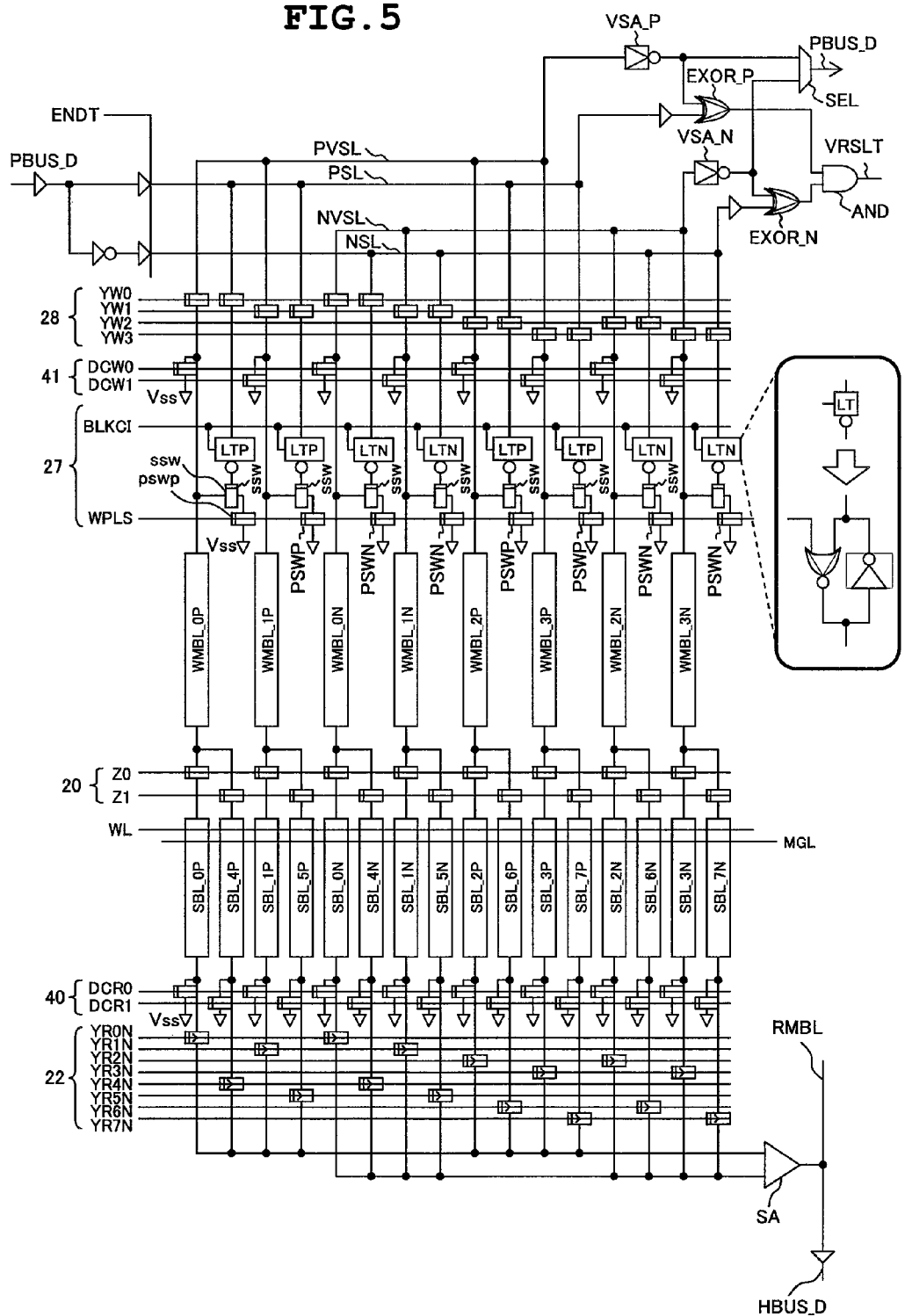
FIG. 5 is a circuit diagram exemplifying circuit configurations for reading and writing data in detail.

Referring to FIG. 5, examples of circuit configurations for data read and data write are shown in detail. In the drawing, eight used-for-write main bit lines WMBL_0P to WMBL_3P, and WMBL_0N to WMBL_3N are exemplified, and a memory mat connected with the main bit lines is shown as one example. While the circuit is not limited particularly, sub bit lines SBL_0P to SBL_7P and SBL_0N to SBL_7N are arranged in the circuit, and of these sub bit lines, two lines are allocated to each used-for-write main bit line. Incidentally, the memory cells MC1 and MC2 are omitted from the drawing. The numeral suffix of a reference character which each sub bit line is marked with represents the column number of the corresponding twin cell. The alphabetical suffix P shows that it is a sub bit line connected with one memory cell MC1 (positive cell) of the twin cell; the suffix N shows that it is a sub bit line connected with the other memory cell MC2 (negative cell) of the twin cell. The alphabetical suffix P of a reference character which each write main bit line is marked with shows that it is a write main bit line connected with the positive cell of a twin cell. The suffix N shows that it is a write main bit line connected with the negative cell of a twin cell. The numeral suffix represents a smaller column number of column numbers of corresponding twin cells.

Select signals YR0N to YR7N are for switching control of the used-for-read selector 22. According to the select signals, the selector 22 selects a pair of sub bit lines which have the same twin cell column number, and connects the selected positive cell-side and negative cell-side sub bit lines to the differential input terminals of the sense amplifier SA. The differential input terminals of the sense amplifier SA each have a current source transistor (not shown), and the current source transistor is activated in reading. In reading, when a twin cell is selected with a word line, the positive and negative cells of the selected twin cell are complementarily switched according to twin cell data stored therein, whereby a potential difference is developed between the differential input terminals of the sense amplifier SA. The sense amplifier SA amplifies the resultant potential difference, and then outputs the twin cell data of the twin cell onto the corresponding used-for-read main bit line RMBL.

Between a pair of sub bit lines selected by the used-for-read selector 22, the sub bit lines are left unselected, which depend on the column number arrangement of the twin cell and the way the used-for-read selector 22 selects sub bit lines. For instance, when the sub bit lines SBL_0P and SBL_0N are selected, the sub bit lines SBL_4P, SBL_1P and SBL_5P are placed therebetween. The used-for-read discharge circuit 40 is a circuit for selectively connecting the sub bit lines SBL to the ground potential Vss according to discharge signals DCR0 and DCR1. The used-for-read discharge circuit 40 connects the sub bit lines, which are made unselected by the sub bit line selector 20, to the ground potential. For instance, when the sub bit lines SBL_0P and SBL_0N are selected in reading, the sub bit lines SBL 4P and SBL_5P located therebetween are connected with the ground potential Vss. Other sub bit lines, which lie between the sub bit lines selected for read and are connected with the ground potential, serve as ground shields for complementary data to be readout to sub bit lines targeted for select for read. Therefore, it is possible to prevent a malfunction owing to undesired capacity coupling.

The twin cell amplifies differential signals depending on complementary data that the twin cell holds per se in reading. Therefore, even when there is an error in current supplied to the sub bit line from the current source transistor, the influence on differential amplification is smaller than that in the case where sense amplification is performed using a current signal of the middle between the differential signals as a reference current.

Write of Twin Cell Data

Figure 6:
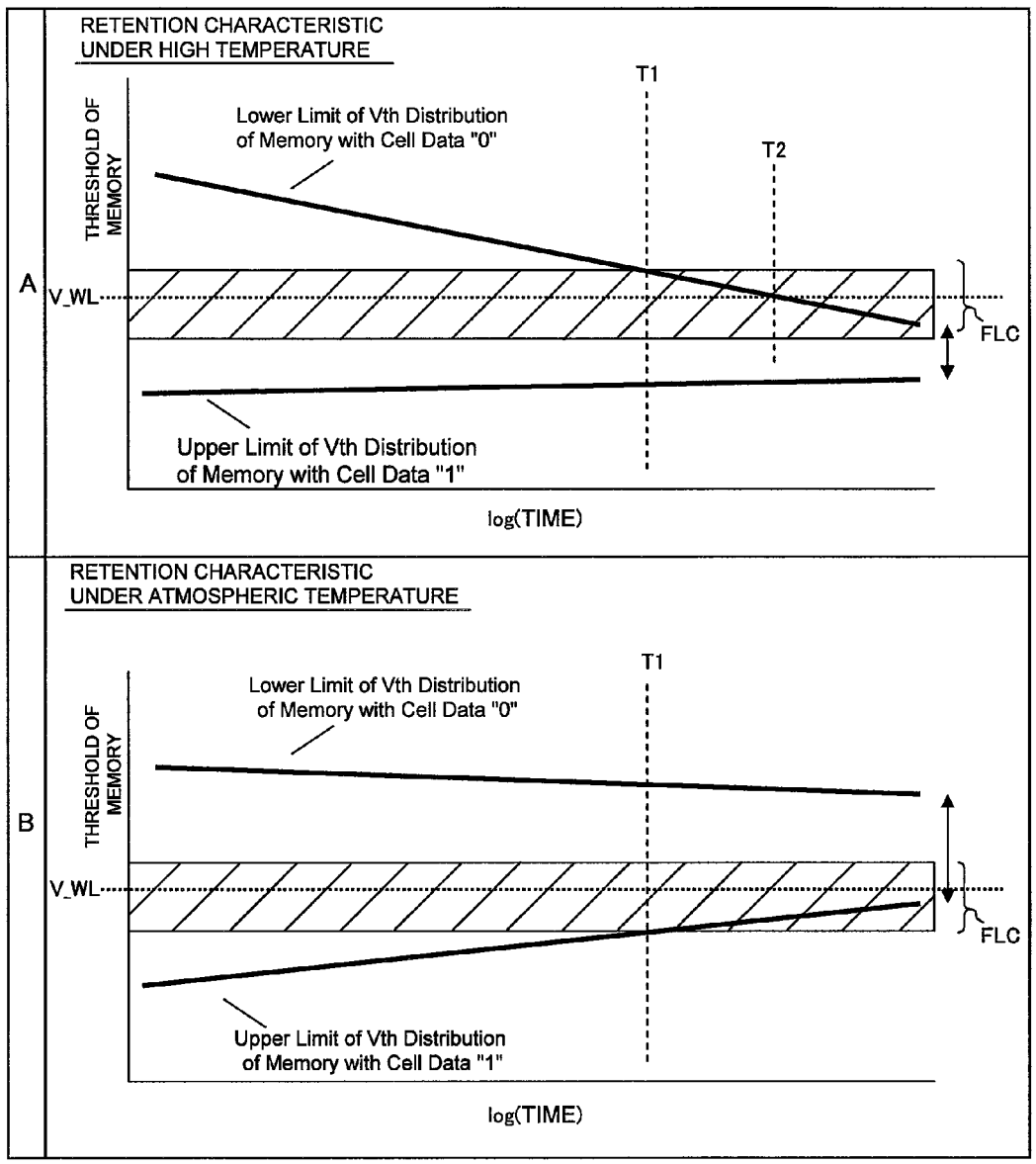
FIGS. 6A and 6B are diagrams exemplifying retention characteristics of a twin cell.

Now, the retention characteristic of a twin cell will be considered here. Under a temperature of e.g. 160° C. which is an upper limit of the operation-assurable range of the twin cell, the threshold voltage of a memory cell (high-threshold voltage memory cell) holding the cell data "0" decreases with time, and the threshold voltage of a memory cell having the cell data "1" does not change so much as shown in the example of FIG. 6A. Under an atmospheric temperature, the threshold voltage of a memory cell (low-threshold voltage memory cell) holding the cell data "1" increases with time, and the threshold voltage of a memory cell holding the cell data "0" does not change so much as shown in the example of FIG. 6B. Regardless of the secular variation in threshold voltage of a twin cell after data have been written into the twin cell, sense amplification of twin cell data can be performed as long as a potential difference is formed by differential signals because differential signals formed according to complementary data held by the twin cell are subjected to differential amplification in reading as described above. Considering the relation between the threshold of the memory and the reference current variation range FLC, when amplification is performed by a sense amplifier using a current signal of the middle between the differential signals as a reference current, the life time expires at Time T1. A storage form that complementary data are held by a twin cell can extend the life time to Time T2 under a high temperature, and further extend the life under an atmospheric temperature. The reference character V_WL denotes a word line select level at that time.

The write data latch circuit 27 has: static latches LTP and LTN each having a reset function using a signal BLKCI; current switches PSWP and PSWN for passing a write current according to the pulse width of a write pulse WPLS; and write select switches SSW for selectively connecting the main bit lines and current switches PSWP and PSWN according to the values of inversion storage nodes of the static latches LT. The write data supplied to non-inverted signal line PSL from the data bus PBUS_D are selectively supplied by the rewrite column selector 28 to the static latches LTP corresponding to the main bit lines allocated to positive cells. The inverted write data supplied to inverted signal line NSL from the data bus PBUS_D are selectively supplied by the rewrite column selector 28 to the static latches LTN corresponding to the main bit lines allocated to negative cells. The reference character ENDT denotes an input gate signal of write data to the signal lines PSL and NSL. The main bit lines allocated to the positive cells are all connected with a non-inverted verify signal line PVSL through the rewrite column selector 28 together. Also, the main bit lines allocated to the negative cells are all connected with an inverted verify signal line NVSL through the rewrite column selector 28 together. Select signals YW0 to YW3 are for switching control of the used-for-rewrite column selector 28. According to the select signals, the selector 28 connects a pair of main bit lines which have the same twin cell column number to the signal lines PSL and NSL, and connects the corresponding static latches LTP and LTN to the signal lines PSL and NSL. In writing, write data input through the data bus PBUS_D is input to the signal lines PSL and NSL as complementary data and then latched by one pair of static latches LTP and LTN selected by the used-for-rewrite column selector 28. At this time, one of the static latches LTP and LTN latches data "1", and the other latches data "0". A write current from the source line is not passed through the main bit line associated with the latch data "1", whereas a write current from the source line is passed through the main bit line associated with the latch data "0". As a result, the cell data "1" is written into one memory cell of the selected twin cell, and the cell data "0" is written into the other memory cell. In write verify, the information stored in the twin cell for which a write operation is selected is read out into a pair of main bit lines, transmitted to the verify signal lines PVSL and NVSL by the rewrite column selector 28, and then amplified by the verify sense amplifiers VSA_P and VSA_N which each have a single end structure and produce an inverted and amplified output. Also, in writing, the data held by the static latches LTP and LTN, in which write data are stored, are transmitted to the signal lines PSDL and NSL by the used-for-rewrite column selector 28 in the same way. The state of data written in the positive cell can be verified by using the exclusive OR gate EXOR_P to check whether the output of the verify sense amplifier VSA_P agrees with the non-inverted write data on the signal line PSL. Likewise, the state of data written in the negative cell can be verified by using the exclusive OR gate EXOR_N to check whether the output of the verify sense amplifier VSA_N agrees with the inverted write data on the signal line NSL. A logical product of the outputs of the exclusive OR gates EXOR_P and EXOR_N is taken by the AND gate AND, and the resultant logical product makes a result VRSLT of the write verify with respect to one bit of write data. When write data is composed of a plurality of bits, the results of the verify will be obtained by taking logical products with respect to all the outputs of the exclusive OR gate corresponding to the plurality of bits. The result of the verify VRSLT is supplied to the flash sequencer 7.

The outputs of the verify sense amplifiers VSA_P and VSA_N can be selectively output to the peripheral data bus PBUS_D by the selector SEL. This read path forms a read path for performing single-end amplification of information stored in the twin cell, i.e. a combination of information stored in the negative cell or information stored in the positive cell, and outputting the resultant information to the peripheral data bus PBUS_D. In the operation of outputting read data to the peripheral data bus PBUS_D from the selector SEL, one verify sense amplifier VSA_P or VSA_N, the output of which is selected as an input to the selector SEL, is activated. However, the invention is not so limited particularly. That is, the verify sense amplifier VSA_P is activated when the selector SEL selects the output of the verify sense amplifier VSA_P, and the verify sense amplifier VSA_N is activated when the selector SEL selects the output of the verify sense amplifier VSA_N. The verify sense amplifiers VSA_P and VSA_N are not required to work at a high speed as the sense amplifier SA is required because of their characteristics, and therefore the circuit configuration and the mutual conductance of MOS transistors included in the circuit can be made relatively smaller. As a result, the read operation using the verify sense amplifiers VSA_P and VSA_N can be made smaller in power consumption in comparison to the read operation using the sense amplifier SA.

The used-for-write discharge circuit 41 is a circuit for selectively connecting the main bit lines WMBL for write to the ground potential Vss according to discharge signals DCW0 and DCW1. The used-for-write discharge circuit 41 connects the main bit lines WBML for write, which are made unselected by the rewrite column selector 28, to the ground potential Vss. For instance, when the write main bit lines WMBL_0P and WMBL_0N are selected in a verify operation after rewrite, the write main bit line WMBL_1P located between them is connected with the ground potential Vss. Other main bit lines, which lie between the main bit lines for differential write selected in the verify operation after rewrite and are connected with the ground potential, serve as ground shields against the differential signals arising on the main bit lines selected in the verify operation after the rewrite. Therefore, it is possible to prevent a malfunction caused by undesired capacity coupling.

Operation Mode

Figure 7:
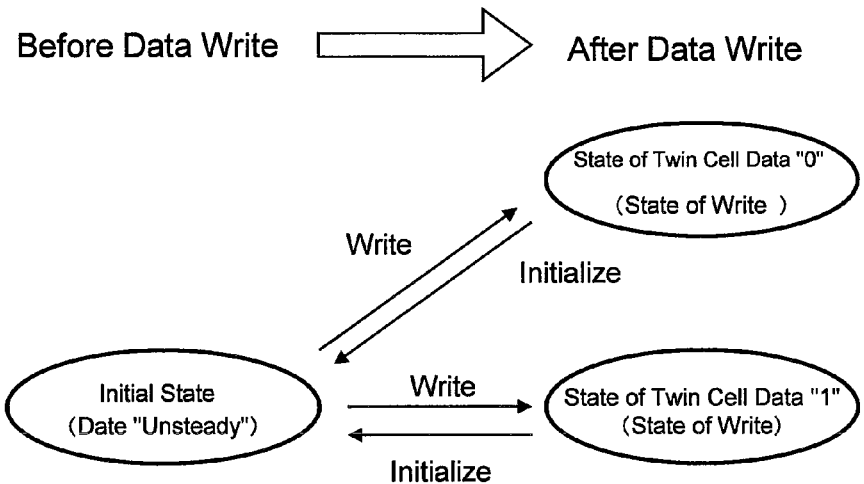
FIG. 7 is a transition diagram showing relations between the data states and operation modes of the twin cell.

FIG. 7 shows relations between the data states and operation modes of the twin cell. The data state of the twin cell means a state which can be recognized from the outside of the flash memory, i.e. a state which the CPU 2 can recognize. The twin cell has the following three data states: an initial state (or a beginning state); a state of twin cell data "1"; and a state of twin cell data "0". The state of the twin cell cannot be changed between the sate of twin cell data "1" and the state of twin cell data "0" directly. The initial state is a state in which one pair of memory cells MC1 and MC2 of the twin cell holds cell data "1". In this case, the stored information as a result of differential readout by the sense amplifier SA becomes unsteady. The flash sequencer 7 controls the initialize operation in response to a direction of initialization given by the CPU 2, etc. thereby to realize the initial state; in the initialize operation, both the data held by the memory cells MC1 and MC2 of a twin cell specified by an initialization address are made the same cell data "1", whereby the twin cell is initialized. Also, the flash sequencer 7 controls the write operation in response to a direction for write given by e.g. the CPU 2 thereby to realize the state of twin cell data "1" or the state of twin cell data "0"; in the write operation, the cell data "1" held by one of the paired memory cells MC1 and MC2 of a twin cell specified by a write address is changed to the cell data "0", and then complementary data are written in the twin cell. As a flash memory has the feature of being erased collectively, it is impossible to obtain the initialization state for each bit by random access. The number of twin cells targeted for the write operation is made equal to the unit in which a plurality of twin cells are brought to their initialization states, or made an integral submultiple of the unit of twin cells when their states are changed to the initialization states. Hence, the CPU 2 is sometimes required to save information stored in the twin cell to be brought to the initialization state into a RAM or the like in advance when performing the initialize operation. An example of such case is when part of the saved data must be written back again.

Figure 8:
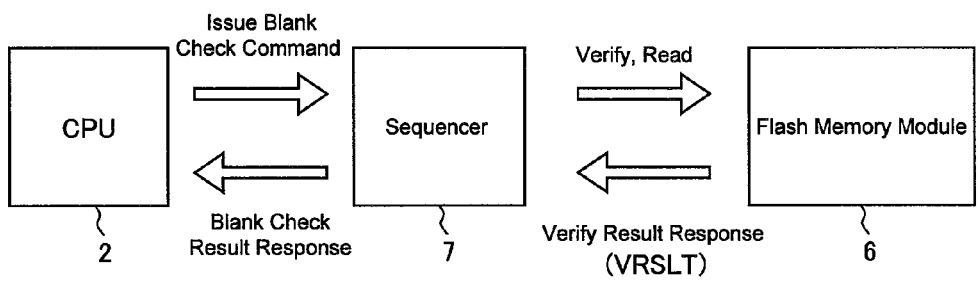
FIG. 8 is a block diagram exemplifying a form of control by a flash sequencer in response to a blank check command for identifying an initial state.

When data of a twin cell in the initial state is read out with the sense amplifier SA, the resultant data is unsteady. Therefore, the state of the twin cell cannot to be differentiated based on the read data obtained in the sense amplifier SA. The flash sequencer 7 controls a check operation for discriminating the initial state from the state of twin cell data "1" or the twin cell data "0". For instance, as exemplified by FIG. 8, the flash sequencer 7 responds to a direction for checking initialization (blank check command) given by the CPU 2, etc., and performs check control for outputting, from the flash memory module 6, the identifying information about whether or not a twin cell specified by a check address is in the initial state. Specifically, the flash sequencer 7 uses signals BLCCI to reset the static latch circuits LTP and LTN associated with a twin cell specified by a check address thereby to make the latch circuits LTP and LTN hold the data "1". Also, the flash sequencer 7 causes data of the memory cells MC1 and MC2 of a twin cell specified by a check address to be outputted from the twin cell onto a pair of main bit lines. Then, the flash sequencer 7 uses the exclusive OR gates EXOR_P and EXOR_N to make a judgment about whether or not the output data from the memory cells MC1 and MC2 agree with data "1" held by the corresponding static latch circuits LTP and LTN as conducted in the write verify operation. The logical product, i.e. the result of the judgment, is output according to the signal VRSLT. The flash sequencer 7 identifies the twin cell in the initial state based on "1" of the signal VRSLT, and sends the result thereof back to the CPU 2 as a response to the direction for checking initialization.

Figure 9:
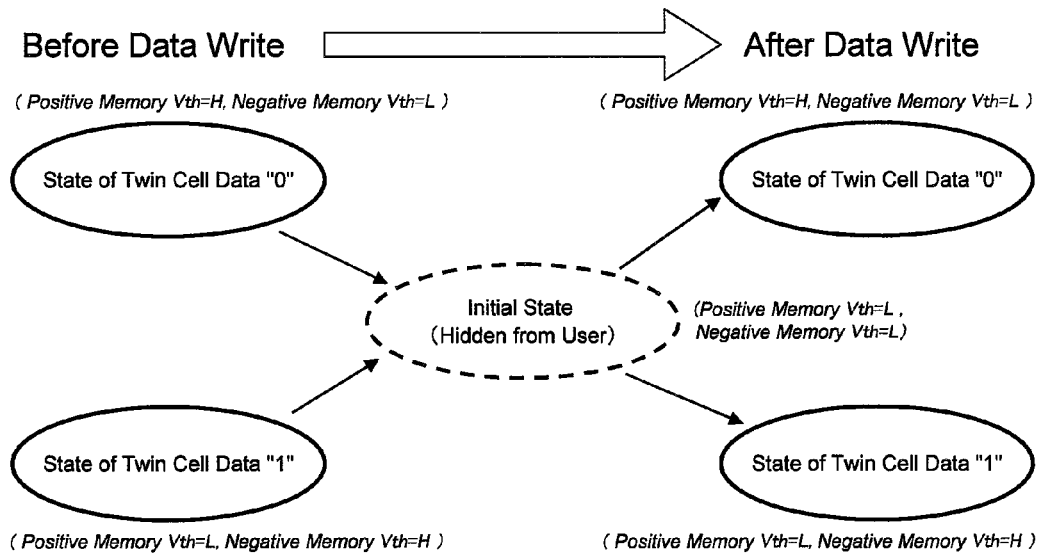
FIG. 9 is a transition diagram showing other relations between data states and operation modes of the twin cell.

FIG. 9 shows other relations between the data states and operation modes of the data cell. In FIG. 9, there are two data states of a twin cell, i.e. the state of twin cell data "1" and the state of twin cell data "0". The twin cell can transition between the state of twin cell data "1" and the state of twin cell data "0" directly. However, the twin cell data state cannot be made the state of twin cell data "1" and the state of twin cell data "0" by random access because of the characteristics of a flash memory. To write the cell data "0", it is necessary that memory cells be erased collectively and brought to a so-called erase state of cell data "1" in advance. In brief, to make a twin cell transition between the state of twin cell data "1" and the state of twin cell data "0", it is necessary that the twin cell pass through a intermediate state the same as the initial state as described above between the states. On this account, an initial state closed to the CPU 2, etc. (or hidden from a user) exists. The flash sequencer 7 controls the write operation in response to a write direction given by the CPU 2, etc.; in the write operation, both the data held by the memory cells MC1 and MC2 of a twin cell specified by a write address are made the same cell data "1", and the data held by one of the relevant memory cells MC1 and MC2 is changed to the cell data "0" according to the write data, followed by writing complementary data according to the write data into the twin cell involved. When the twin cell goes through the intermediate state the same as the initial state, information stored in the memory cells targeted for erase is saved into a RAM in the sequencer before erase. All or part of the data saved in the RAM in the sequencer are overwritten by write data supplied from the outside. Thereafter, the resultant data are transmitted to the static latches LTP and LTN and written into the memory cells which have been erased.

In the case as shown in FIG. 9, the following two data states are open to a user, and the unsteady state is never referred to by the CPU 2, etc.; the state of twin cell data "1"; and the state of twin cell data "0". However, the twin cell must go through the intermediate state the same as the initial state necessarily when the sequencer 7 responds to a write direction, and therefore, it takes an apparently longer time until the completion of response to the write direction.

Command

Referring to FIG. 10, the commands for controlling the data states shown in FIG. 7 are exemplified in Column (A) of the table. An initialize command (ICMD) is used for setting the initial state. A write command (PCMD) is for setting the state of twin cell data "1" and the state of twin cell data "0". A blank check command (BCMD) is for confirming the initial state. The above commands are directed by issuing two write accesses with a given address and data specified therein. For instance, the initialize command (ICMD) is directed to the flash sequencer 7 when the CPU issues an access operation to write data 20H at a certain address (a flash address) and to write data D0H at a flash memory address (an initialize block address), at which the cell should be made the initial state. In response to this, the flash sequencer 7 controls the initialize operation with respect to the initialize block address. The write command (PCMD) is directed to the flash sequencer 7 when the CPU issues an access operation to write data E8H at a certain address (a flash address) and to put write data at a flash memory address (write address), at which write should be performed. In response to this, the flash sequencer 7 performs write control for putting write data into a twin cell at the write address. The blank check command (BCMD) is directed to the flash sequencer 7 when the CPU issues an access operation to write data 71H at a certain address (a flash address), and to write data D0H at an initialize block address, at which a check should be made. In response to this, the flash sequencer 7 performs the above-described blank check control with respect to the blank check address.

Referring to FIG. 10, a command for controlling the data states shown in FIG. 9 is exemplified in Column (B) of the table. The write command (PECMD) is for setting the state of twin cell data "1" and the state of twin cell data "0". The command (PECMD) is directed by issuing two write accesses with a given address and data specified therein. The write command (PECMD) is directed to the flash sequencer 7 when the CPU 2 issues an access operation to write data E8H at a certain address (a flash address) and to put write data at a flash memory address (a write address), at which write should be performed. In response to this, the flash sequencer 7 performs write control including the steps of: saving the twin cell data of an erase block address containing the write address into a RAM in the sequencer; initializing a twin cell at the erase block address into the cell data "1"; updating the saved data with write data; transmitting the resultant data to the static latches LTP and LTN; and writing the data into the twin cell.

The flash memory including the flash memory module 6 and flash sequencer 7 as described above has the following effect and advantage.

The flash memory eliminates the need for a reference voltage or reference current to produce a reference potential of a differential sense amplifier SA. Therefore, there is no need for estimating the margin of variations in reference voltage or reference current, and the circuit can be simplified.

The pair of inputs of the differential sense amplifier SA are connected with memories, and therefore the dependence of memory currents on the source voltage Vcc can be canceled.

When the voltage of word line and the threshold voltages (Vth) of the memory cells MC1 and MC2 are set so that the word line voltage is lower than a temperature intersection point of a drain current of the low-Vth memory cell, the temperature dependence of memory currents of one of memory cells MC1 and MC2, which hold complementary data, can be canceled. That is, characteristic curves showing the relation between a control gate voltage of a memory cell and a current between a source and drain have temperature dependence as in the cases of typical MOS transistors and intersect each other at a certain point. However, by setting word line voltages so that both the low-Vth and high-Vth memories have temperature dependence of the same direction, the temperature dependences of a pair of cells MC1 and MC2, whose threshold voltages are set complementarily can be made uniform. Therefore, the reduction in difference of read signals can be canceled by means of the temperature dependence.

As inverted data is also transmitted to a data transmission path of a negative-side memory cell corresponding to a data transmission path of a positive-side memory cell, it is suffice for a user program to forward only write data to the positive-side memory. As a result, data transmission time can be halved.

Similarly, verify sense amplifiers SA are prepared for positive-side and negative-side memory cells and made dedicated to their exclusive use respectively. Because of having the function of sending back the results of verify for both the positive- and negative-sides with Pass/Fail of one bit, it is suffice for a user program to use only a positive-side address to verify and thus the time of verify reduces to the half.

In a method that complementary data is read out, the result of read when the initial state is read at a high speed is unsteady. Accordingly, some blank check function is needed. Herein, the command control function of the flash sequencer 7 is used and therefore a blank check is performed according to the same operation as the verify read operation. As a result, the need for coupling a circuit for a blank check to an input node of the sense amplifier SA for high-speed read is eliminated. Then, it becomes possible to ensure high-speed read by the sense amplifier SA. As another blank check function, the flash memory module 6 may have a read function for blank check, however it is not shown in the drawing particularly. For instance, when there is a direction of a blank check operation, a selector for making one of the differential inputs of the hierarchical sense amplifier SA for high-speed read of the flash memory module a fixed voltage for a reference may be provided. When the reference voltage of the hierarchical sense amplifier SA is made constant, the speed for readout is reduced. Therefore, in the blank check mode, it is required to switch operations of a timing generator and 10 circuit so that a read action is performed taking double the time or longer for read. When a blank check function is added to the high-speed sense amplifier SA, it is not required to transition to the verify mode as in the case of using the blank check mode.

Second Microcomputer

FIG. 11 shows a second microcomputer (MCU) 1A according to the invention. Here, the following two operations will be described in detail: a read operation including using the differential sense amplifier SA to differentially amplifying information stored in a twin cell, and sending the result to a high-speed bus HBUS; and a read operation including using the single-ended verify sense amplifiers VSA_P and VSA_N to perform single end amplification on the information stored in the twin cell, and then send the data to the low-speed peripheral bus PBUS. The second microcomputer differs from the first one in a function of the bus interface circuit 4A. Other parts or portions are the same as those shown in FIG. 1, and therefore their detailed description will be omitted.

The sense amplifier SA shown in FIG. 5 constitutes a first read circuit for differentially amplifying complementary data read into different sub bit lines from a pair of storage devices of a twin cell selected with word line WL. The verify sense amplifiers VSA_P and VSA_N constitute a second read circuit for amplifying data read from one storage device of the selected twin cell. The flash sequencer 7 forms a write control circuit having a write mode in which a pair of storage devices of the selected twin cell are made to hold non-inverted data and inverted data of write data of one bit. The high-speed access port HACSP performs an output operation in a first read mode. In the output operation, non-inverted data and inverted data read out from a pair of storage devices of the selected twin cell are differentially amplified by the sense amplifier SA, and then the resultant data are output to the outside.

The low-speed access port LVCSP performs an output operation in the second read mode, in which data read out from one storage device of the selected twin cell are amplified by the verify sense amplifier VSA_P or VSA_N, and the resultant data is output to the outside.

According to the output operation in the first read mode, as shown in FIG. 12, a current flows through one sub bit line in both the read of data "0" and read of data "1". Thus, in the output operation in the first read mode, the operating current consumed in the flash memory is unchanged regardless of a value of read data, which can make difficult data estimation by current observation. In the case of the output operation in the second read mode, the current going through the verify sense amplifier differs between data "0" read and data "1" read. The difference of the operating current correlates with the difference of data. The output operation in the second read mode enables data estimation unlike the output operation in the first read mode.

The differential amplification operation by the sense amplifier SA enables the decision of the output at an earlier time in comparison to the amplification operation using a single end input by the verify sense amplifier VSA_P or VSA_N. The differential amplification in the first read mode enables high-speed read. The single end amplification in the second read mode enables low-power consumption read even though it is performed at a low speed. To built the high-speed access port HACSP and the low-speed access port LACSP discretely allows individual connections of buses HBUS and PBUS depending on the difference of the read operations.

Figure 13:
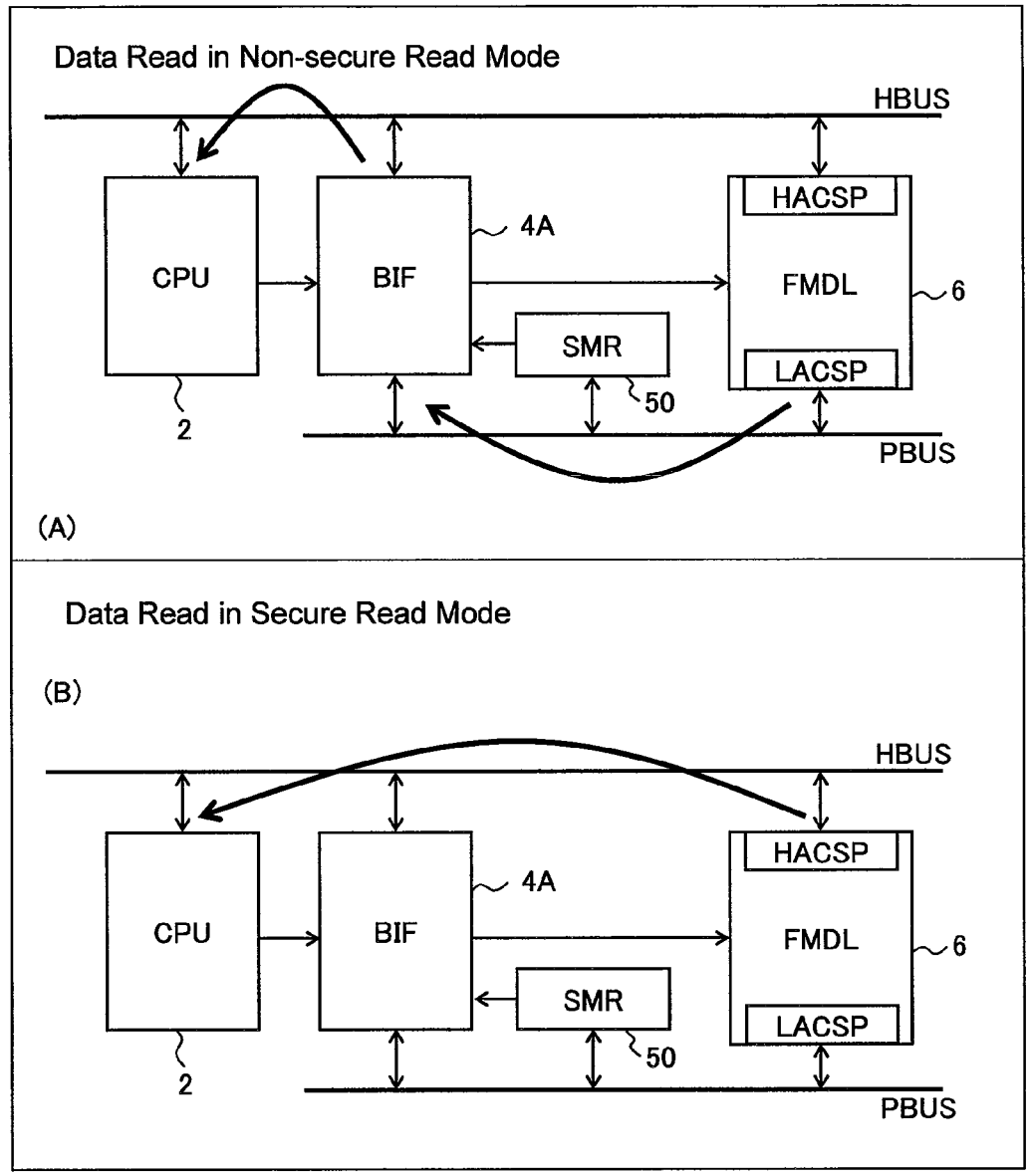
FIGS. 13A and 13B are block diagrams showing read data transmission systems in secure and non-secure modes respectively.

When responding to a request for read access from the central processing unit 2, the bus interface circuit 4A designates the high-speed access port HACSP in the first read mode or the low-speed access port LACSP in the second read mode according to the address targeted for the access. Thus, control for switching the accesses to the individual high-speed access port HACSP and low-speed access port LACSP can be realized using the bus interface circuit 4A relatively easily. The configuration so far is the same as the case shown in FIG. 1. Particularly, according to the configuration shown in FIG. 11, the bus interface circuit 4A has a secure mode register (SMR) 50. When responding to a request for read access from the central processing unit 2, the bus interface circuit 4A designates the first read mode for the high-speed access port HACSP and the second read mode for the low-speed access port LACSP according to an address targeted for access as described above if the mode register 50 is in the first state (non-secure read mode). When the mode register is in the second state (secure read mode), the bus interface circuit 4A designates the first read mode for the high-speed access port HACSP regardless of the address targeted for access. Therefore, under the secure mode, with any read operations to the flash memory, the output operation by differential amplification in the first read mode is performed on read data. FIG. 13A shows a transmission path for read data in the non-secure read mode according to the CPU 2. FIG. 13B shows a transmission path for read data in the secure read mode according to the CPU 2. The control with reinforced security can be realized using the bus interface circuit 4A according to the setting of the mode register 50 relatively with ease. The secure mode register 50 is mapped to an address space of the CPU 2, and its value is set by the CPU 2, for example. Incidentally, in FIG. 13 the secure mode register 50 is shown outside the bus interface circuit 4A temporarily. This implies that as for the physical layout of the secure mode register 50 and the bus interface circuit 4A, they may be spaced apart from each other.

FIG. 14 exemplifies the above-described operation forms by the bus interface circuit. In the non-secure mode, a program is stored in e.g. a first half portion of an address space of the flash memory, and in the latter half portion data used by the program are stored. When the central processing unit 2 fetches a program instruction, it is necessary to perform a read operation in sync with the operation speed of central processing. On this account, the circuit is arranged so that it executes a differential read operation (complementary read operation) thereby to read an instruction at a high speed and outputs to the high-speed bus HBIS. In contrast, the data which does not require access in sync with the operation speed of the central processing unit 2, is stored in a second half portion of the address space, the access to such data is executed through the peripheral bus PBUS. Thus, the power consumption of the circuit can be reduced further in comparison to access to the first half portion of the address space. Herein, the non-secure mode is designated by the value "0" of the secure mode register 50; the secure mode is designated by the value "1" of the secure mode register 50.

In regard to the data write operation, in the case of a normal write operation, the circuit produces data in a complementary relation with data supplied from the CPU 2 through the peripheral bus PBUS again, sets the data thus produced on the latch LT, and write the data into a memory cell connected with the latch LT through the bit line MBLiP/MBLiN. In the example shown in FIG. 5, non-inverted and inverted complementary data of the write data are transmitted to the latch LT through one line, data transmission enable signal ENDT. However, another arrangement may be made. As an example of this, although not shown in the drawing, the arrangement as described below is possible. That is, paths of non-inverted and inverted complementary data of write data are individually controlled using the data transmission enable signals, thereby to transmit the data only to the latch LT connected with one bit line and write the data into the memory cell. In this case, power consumption in the write operation can be reduced.

In a secure write operation, data supplied from the central processing unit 2 through the peripheral bus PBUS is set as complementary data on the latch LT, and written into the memory cell connected to the latch LT through the bit line MBLiP/MBLiN. In the secure write operation, it is necessary to perform a write operation with complementary data. In FIG. 5, the circuit is arranged so that write data supplied through the peripheral data bus PBUS_D from CPU 2 is inverted by an inverter, thereby to set each of non-inverted and inverted complementary data on the latch LT. However, in the case where the CPU 2 outputs and supplies both non-inverted data and inverted data, which make complementary data, to the peripheral data bus PBUS_D, a data path from PBUS_D to LTP and LATM may be set so that data from CPU 2 are set on the latches LT in bits. When doing so, it becomes possible to write 1-bit data into an address region targeted for read for each memory cell only in the first read mode.

In the secure read mode, in any of write and read operations, currents passing through the bit lines are in a complementary relation. Therefore, the whole quantity of current is fixed regardless of the bit pattern of read/write data. As a result, extraction of the bit pattern of data by analysis of current can be made difficult.

Third Microcomputer

Figure 15:
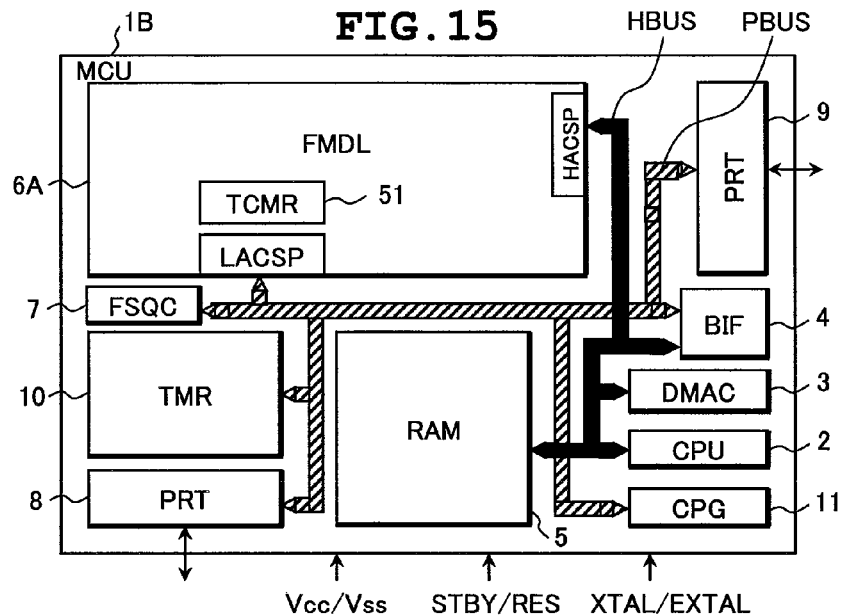
FIG. 15 is a block diagram showing a third microcomputer (MCU) 1B according to an embodiment of the invention.

FIG. 15 shows a third microcomputer (MCU) 1B according to the invention. A configuration of the microcomputer using a nonvolatile memory will be described here, in which the number of twin cells used for stored information of one bit is variable. The configuration is the same as that shown in FIG. 1 except for a function of the flash memory module 6A. Therefore, detailed descriptions of like parts or portions are omitted here. The flash memory module 6A has a twin cell mode register (TCMR) 51 for directing whether to use a plurality of twin cells or one twin cell for stored information of one bit. The twin cell mode register 51 is mapped to an address space of the CPU 2. The value of the register 51 is set, for example, by the CPU 2.

Figure 16:
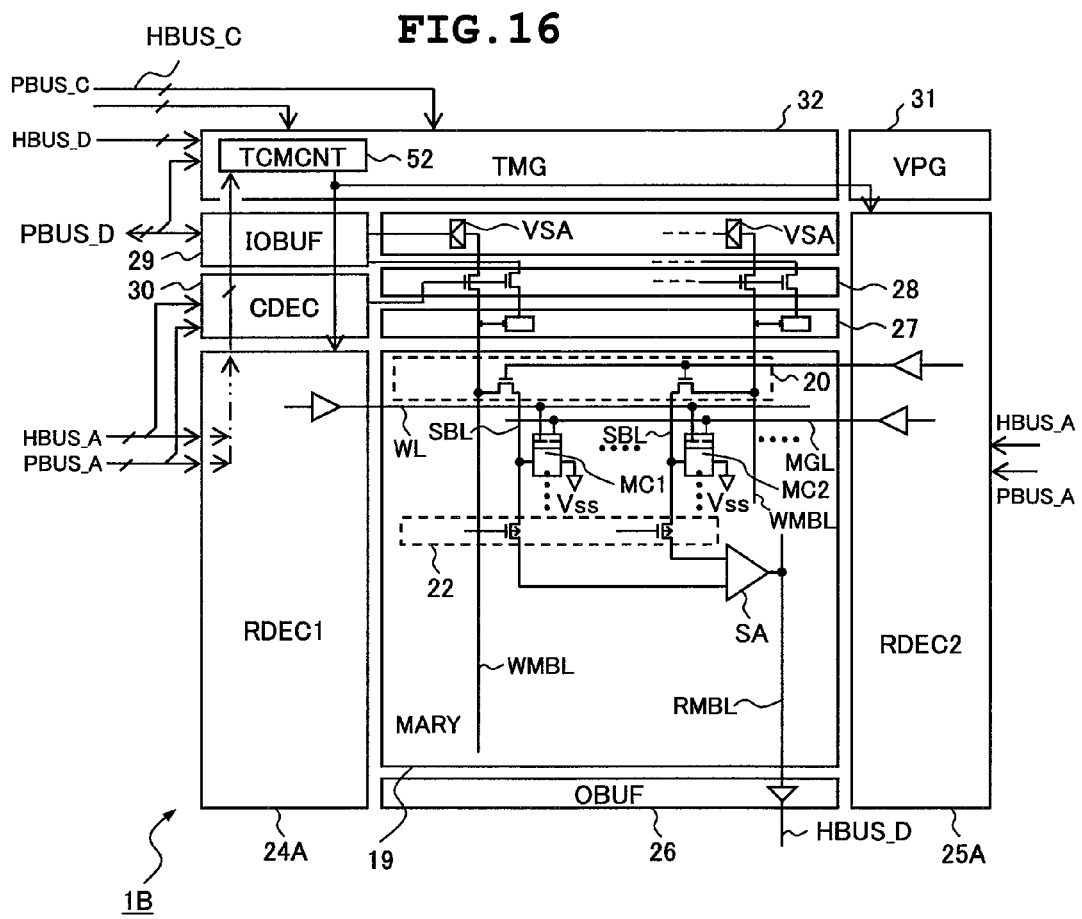
FIG. 16 is a block diagram exemplifying the structure of a flash memory module 6A.

The configuration of the flash memory module 6A is exemplified in FIG. 16. The suffix D attached to the reference characters PBUS and HBUS shows that the bus is a data bus. The suffix A represents an address bus, and C represents a control bus. The timing generator (TMG) 32A generates an internal control signal for determining the internal operation timing according to an access strobe signal supplied to the high-speed access port HACSP e.g. from the CPU 2, an access command supplied to the low-speed access port LACSP from the flash sequencer FSQC 7, etc. Especially, the timing generator (TMG) 32A has a twin cell mode control circuit (TCMCNT) 52 for controlling whether to use a plurality of twin cells or one twin cell for stored information of one bit according to a setting value of the twin cell mode register (TCMR) 51. The first row decoder (RDEC1) 24A selects a word line WL. The second row decoder (RDEC2) 25A selects a memory gate line MGL and a sub bit line selector 20. The select operations by the first row decoder 24A and the second row decoder 25A follows address information, etc. supplied from the high-speed access port HACSP in the read operation, and follows address information, etc. supplied from the low-speed access port LACSP in the data write operation and initialize operation.

Figure 17:
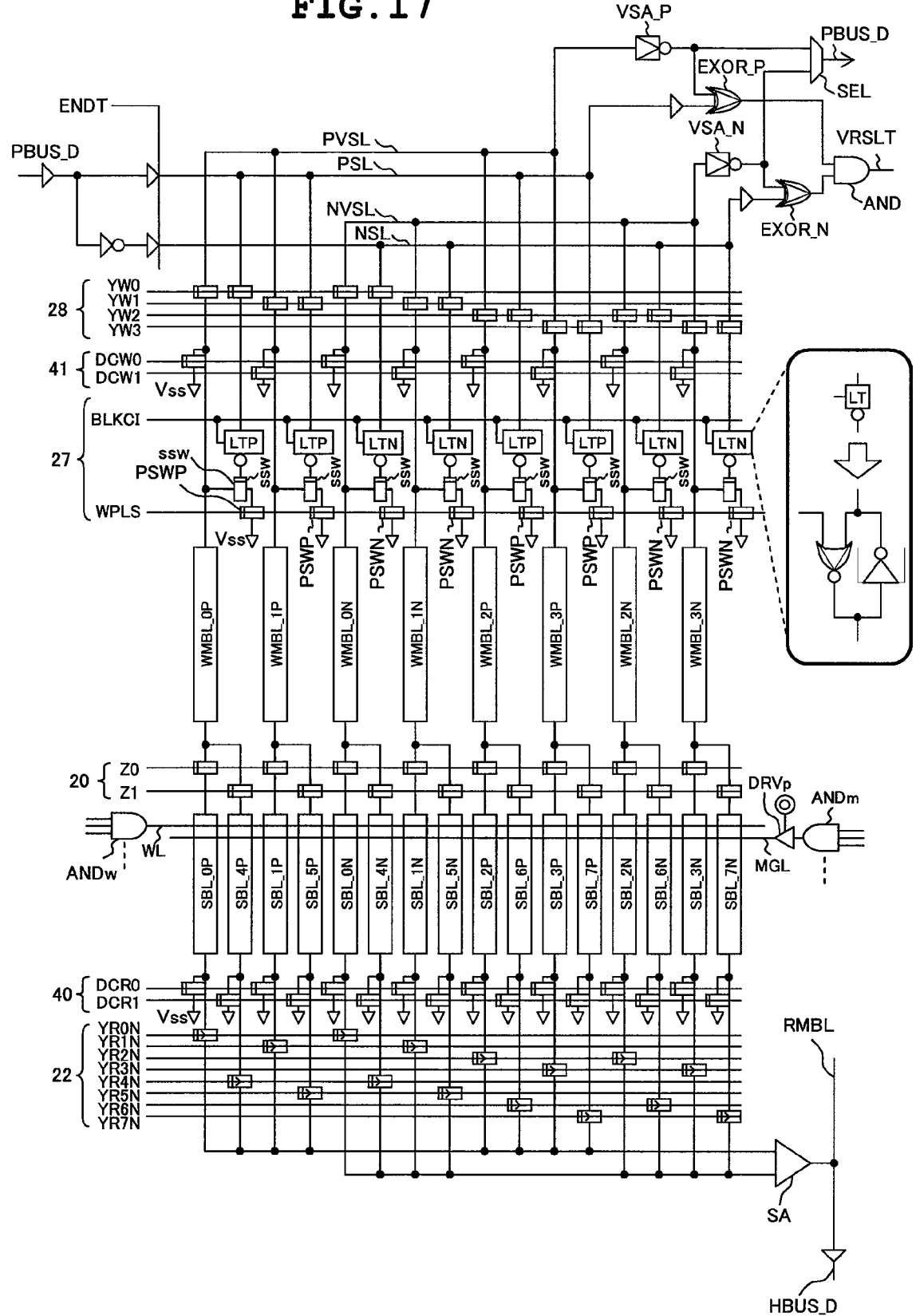
FIG. 17 is a circuit diagram exemplifying circuit configurations for reading and writing data in the flash memory module 6A in detail.

Referring to FIG. 17, examples of circuit configurations for data write and data read in the flash memory module 6A are shown in detail. The memory module differs from that shown in FIG. 5 in that the following three components are shown in the drawing: an three-input AND gate ANDw with an output connected to the word line WL; a high-voltage driver DRVp with a memory gate line MGL arranged thereto; and a three-input AND gate ANDm with its output connected to the high-voltage driver DRVp.

Figure 18:
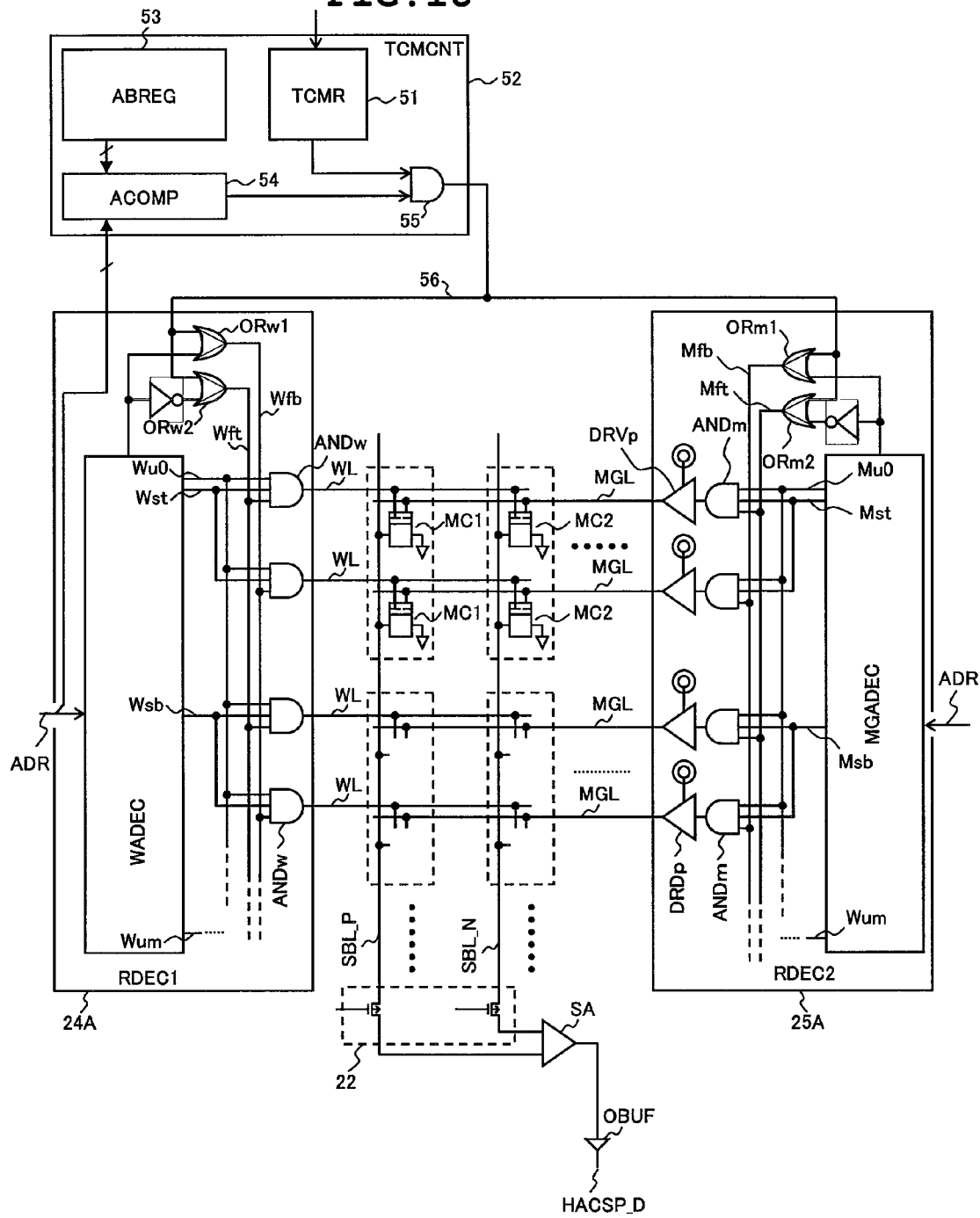
FIG. 18 is a circuit diagram of assistance in explaining switching between a double twin cell mode (4 memory cells/bit) and twin cell mode (2 memory cells/bit), showing examples of a twin cell mode control circuit (TCMCNT) 52, a first row decoder (RDEC1) 24A, and a second row decoder (RDEC2) 25A in the flash memory module 6A.

Referring to FIG. 18, a twin cell mode control circuit (TCMCNT) 52, a first row decoder (RDEC1) 24A, and a second row decoder (RDEC2) 25A in the flash memory module 6A are exemplified.

In the drawing, the reference character ADR collectively represents address signals supplied through the high-speed bus HBUS_A and low-speed bus PBUS_A. In the first row decoder (RDEC1) 24A which decodes an address signal ADR, the AND gate ANDw and OR gates ORw1 and ORw2 form the last decode stage of address signal ADR; and WADEC constitutes its preceding stage. The OR gates ORw1 and ORw2 output complementary signals Wft and Wfb of the least significant bit of an address signal. The complementary signals Wft and Wfb are input to the AND gate ANDw alternately in units of row. The signals Wst and Wsb are complementary signals of the second least significant address bit of the address signal. The signals Wst and Wsb are input to the AND gate ANDw alternately in two rows. Wu0 to Wum represent decode signals of address information from the most significant bit to the third least significant bit of the address signal. The decode signals Wu0 to Wum are supplied to the rank order AND gate ANDw in eight rows. Therefore, when the mode select signal 56 has a logical value of zero (0) (L: Low level), one word line WL is turned to the select level according to the value of an address signal ADR. When the mode select signal 56 has a logical value of one (1) (H: High level), two word lines WL are turned to the select level according to the value of the address signal ADR. Also, in regard to the second row decoder (RDEC2) 25A, select signals Mft, Mfb, Mst, Msb and Mu0 to Mum are produced by MGADEC, OR gates ORm1 and ORm2, AND gate ANDm in the same way. Hence, when the mode select signal 56 has a logical value zero (0) (L: Low level), one memory gate line MGL is turned to the select level according to the value of the address signal ADR. Further, when the mode select signal 56 has a logical value of one (1) (H: High level), two memory gate lines MGL are turned to the select level according to the value of the address signal ADR.

The twin cell mode control circuit 52 has an address comparator (ACOMP) 54 for judging whether or not the address signal ADR falls in an address range set on the address range setting register (ABREG) 53. When it is judged that the address signal ADR falls in the address range, the control circuit 52 outputs a logical value of one (1) to the AND gate 55. Also, on receipt of a setting value of the twin cell mode register 51 as an input, the AND gate 55 produces a mode select signal 56. When the setting value of the twin cell mode register 51 is a logical value of one (1), the double twin cell mode (4 memory cells/bit) is designated.

In the case where the logical value one (1) is set on the twin cell mode register 51, when a read operation is performed at an address in an address range set on the address range setting register (ABREG) 53, two word lines are selected for an address signal ADR. Stored information of two sets of twin cells connected to the sub bit lines SBL_iP, SBL_iN connected to the selected word lines and selected by the column decoder 30 are read out to the sub bit lines SBL_iP and SBL_iN. When the logical value 0 is set on the twin cell mode register 51, the mode signal 56 has a logical value of zero (0), and therefore one word line is selected according to the address signal ADR. When the double twin cell mode is selected in the read operation, the quantity of signals read out from the memory cells is doubled, and thus the speed of data read can be increased. In comparison to the double twin cell mode, the single twin cell mode is slow in read speed, however it can reduce the power consumption to a lower value. Also, in the write operation, in the double twin cell mode, two memory gate lines MGL are activated to the write level according to the address signal as in the case of the word lines WL. The same logical value data can be written into a memory cells within an address range set on the address range setting register (ABREG) 53 in units of double twin cells as in the read operation. In write operation in units of double twin cells, it is necessary to supply two or more twin cells with a write current in parallel. In the case where a write current supply capacity is small, write to a double twin cell may be performed in units of memory gate lines twice. Also, it is possible to cope with the write in units of double twin cells by inputting a read signal to the AND gate 55.

Figure 19:
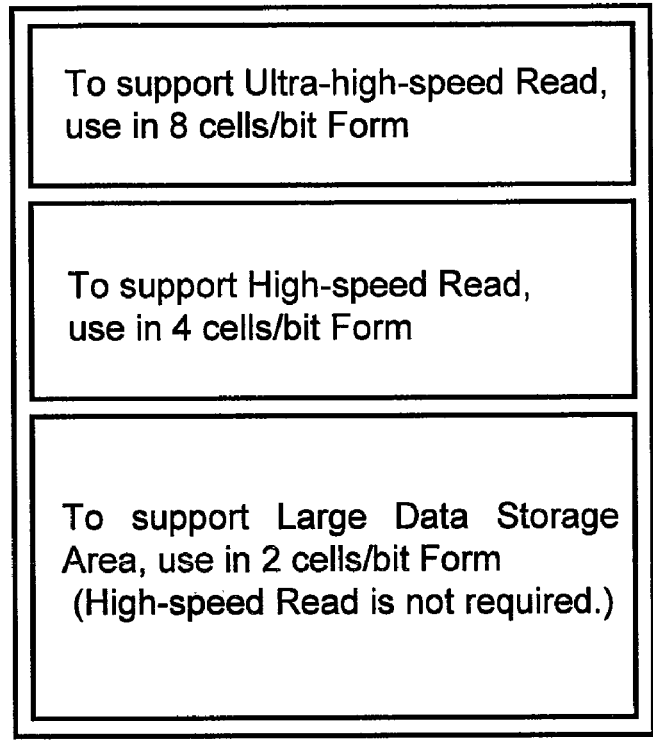
FIG. 19 is an illustration of assistance in explaining another operation mode which enables 8 memory cells/bit.
Figure 20:
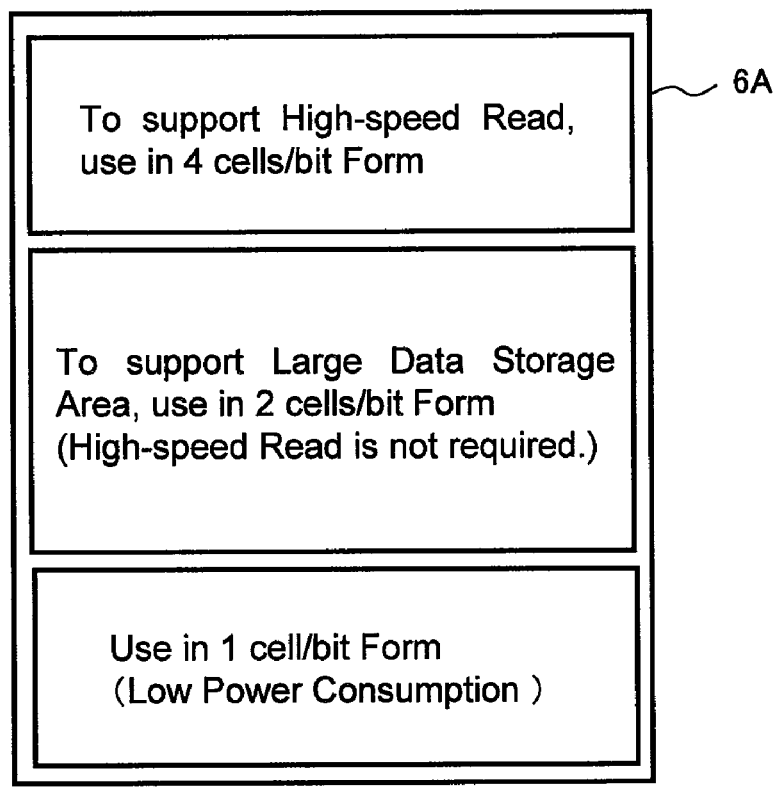
FIG. 20 is an illustration of assistance in exemplifying another access means.

In the example shown by FIG. 18, the double twin cell mode (4 memory cells/bit) and the twin cell mode (2 memory cells/bit) are switched. As shown in FIG. 19, it is possible to add another operation mode which enables 8 memory cells/bit. For instance, for select signals Wst and Wsb, a circuit configuration similar to the twin cell mode control circuit (TCMCNT) 52 may be added. This measure is preferable for applications which needs higher-speed read for some storage regions. In addition, as shown in the example of FIG. 20, access through the low-speed access port LACSP may be made by allocating a region of 1 memory cell/bit to a part of storage region. Also in this case, select control of the low-speed access port LACSP or high-speed access port LACSP depending on an address range may be performed by the bus interface circuit 4 in the same way as described above.

Figure 21:
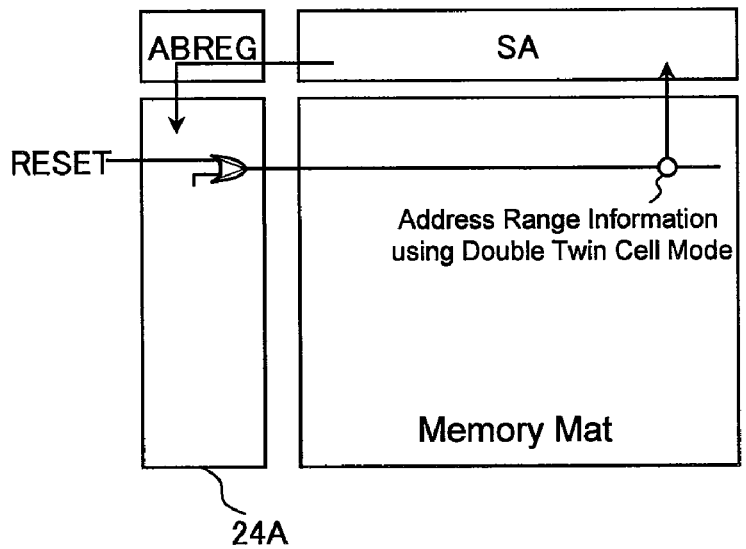
FIG. 21 is a schematic illustration showing an example of the configuration for initial setting of an address range setting register (ABREG) 53.
Figure 22:
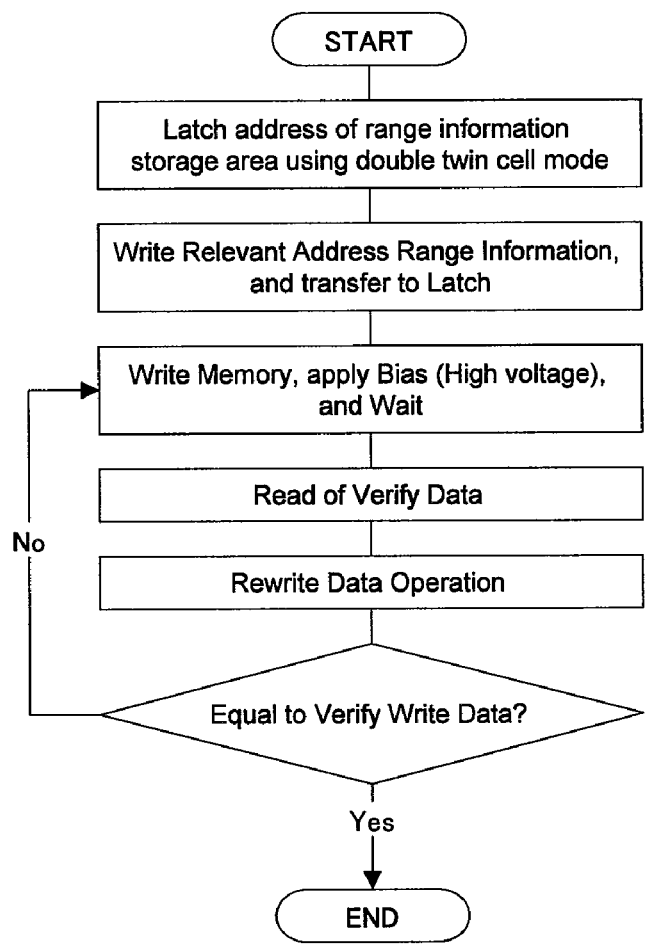
FIG. 22 is a flow chart showing a write control flow when address range information is stored in a region of a certain address of the flash memory module.

FIG. 21 shows the outline of configuration for initial setting for the address range setting register (ABREG) 53. As for address range information to be set on the address range setting register 53, the address is stored in a certain region of the flash memory module. When a reset direction is canceled by a reset signal RES supplied to the microcomputer 1B, in response to this, address range information is read out and set on the address range setting register 53 as an initial setting. FIG. 22 shows a write control flow when address range information is stored in the flash memory module at a certain address. The write control is performed through a normal write operation and a verify operation. FIG. 23 exemplifies a reset transmission control flow of address range information. When a reset direction by a reset signal RES supplied to the microcomputer 1B is canceled, a reset flag RESET is set to one (1). Then, the address range information is read, initial setting is made on the address range setting register 53, and at the end the reset flag RESET is cleared. When it is desired to change the address range, an address range on the flash memory module may be rewritten into another address range information.

The invention has been described specifically above based on embodiments of the invention, the invention is not so limited. Various changes and modification may be made without departing from the subject matters of the invention.

For example, the bit lines are not limited to the structure of main and sub bit lines. The configuration of the memory array is not limited to the configuration as shown in FIG. 5, and it can be changed appropriately. The voltage conditions for changing the threshold voltages of the cells are not limited to the conditions shown in FIG. 3. The invention is not limited to a microcomputer with a flash memory, and it may be widely applied to communication controllers, data processing LSIs including an image processing accelerator, memory LSIs such as a discrete flash memory, a multiple chip module in a single package form including a flash memory and a data processing LSI, and other semiconductor devices.

What is claimed is:

1. A semiconductor device comprising:
   a nonvolatile memory including:
      a plurality of 1-bit twin cells, each having electrically rewritable first and second storage devices, the first and second storage devices holding binary data according to a difference of their threshold voltages,
      a plurality of word lines coupled to the plurality of 1-bit twin cells so that one word line is coupled to select terminals of the first and second storage devices constituting one of the plurality of 1-bit twin cells,
      a plurality of bit lines coupled to the plurality of 1-bit twin cells so that a first pair of bit lines is coupled to the first and second storage devices of a first 1-bit twin cell of the plurality of 1-bit twin cells and another bit line coupled to the first or second storage devices of a second 1-bit twin cell is arranged between the first pair of bit lines coupled to the first and second storage devices of the first 1-bit twin cell of the plurality of 1-bit twin cells, and
      a first read circuit including a first sense amplifier coupled to the first pair of bit lines coupled to the first and second storage devices of the first 1-bit twin cell of the plurality of 1-bit twin cells and for differentially amplifying complementary data output from the first and second storage devices of one of the plurality of 1-bit twin cells selected for read.

2. A semiconductor device according to claim 1, further comprising:
   a second read circuit including a second and a third sense amplifier coupled to receive the complementary data output from the first and second storage devices of the first and second storage devices of the one of the plurality of 1-bit twin cells selected for read.

3. A semiconductor device comprising:
   a plurality of 1-bit twin cells, each having a pair of electrically rewritable and nonvolatile first and second memory cells, the first and second memory cells storing binary data according to a difference of their threshold voltages;
   a plurality of word lines coupled to the plurality of 1-bit twin cells so that one word line is coupled to the first and second memory cells in one of the plurality of 1-bit twin cells;
   a plurality of pairs of bit lines coupled to the plurality of 1-bit twin cells so that one pair of bit lines is coupled to the first and second memory cells of one of the plurality of 1-bit twin cells and another bit line coupled to the first or second memory cells of another 1-bit twin cell is arranged between the one pair of bit lines coupled to the first and second memory cells of the one of the plurality of 1-bit twin cells, and
   a first sense amplifier coupled to the one pair of bit lines coupled to the first and second memory cells of the one of the plurality of 1-bit twin cells and for differentially amplifying complementary data output from the first and second memory cells of the 1-bit twin cell selected for read.

4. A semiconductor device according to claim 3, further comprising:
   a second sense amplifier coupled to receive one of the complementary data output from the first and second storage devices of the 1-bit twin cell selected for read; and
   a third sense amplifier coupled to receive the other of the complementary data output from the first and second storage devices of the 1-bit twin cell selected for read.

5. A semiconductor device comprising:
   a plurality of 1-bit twin cells, each having a pair of electrically rewritable and nonvolatile first and second memory cells, the first and second memory cells storing binary data according to a difference of their threshold voltages;
   a plurality of word lines coupled to the plurality of 1-bit twin cells so that one word line is coupled to the first and second memory cells in one of the plurality of 1-bit twin cells;
   a plurality of pairs of bit lines coupled to the plurality of 1-bit twin cells so that one pair of bit lines is coupled to the first and second memory cells in one of the plurality of 1-bit twin cells and an other bit line coupled to the first or second memory cells of an other 1-bit twin cell is arranged between the one pair of bit lines coupled to the first and second memory cells of the one of the plurality of 1-bit twin cells;
   a first sense amplifier coupled to the one pair of bit lines coupled to the first and second memory cells of the one of the plurality of 1-bit twin cells and for differentially amplifying complementary data output from the first and second memory cells of the 1-bit twin cell selected for read;
   a second sense amplifier coupled to receive one of the complementary data output from the first and second storage devices of the 1-bit twin cell selected for read; and
   a third sense amplifier coupled to receive the other of the complementary data output from the first and second storage devices of the 1-bit twin cell selected for read.

6. A semiconductor device comprising:
   a nonvolatile memory including:
      a memory array having a plurality of 1-bit twin cells, each composed of rewritable nonvolatile first and second storage devices; and
      a first read circuit for differentially amplifying complementary data output from the twin cell selected for read,
   the memory array further comprising:
      a plurality of word lines coupled to the plurality of 1-bit twin cells so that one word line is coupled to the first and second storage devices in one of the plurality of 1-bit twin cells;

a plurality of pairs of bit lines coupled to the plurality of 1-bit twin cells so that one pair of bit lines is coupled to the first and second storage devices of one of the plurality of 1-bit twin cells and another bit line coupled to the first or second storage devices of another 1-bit twin cell is arranged between the one pair of bit lines coupled to the first and second storage devices of the one of the plurality of 1-bit twin cells.

7. A semiconductor device according to claim 6, further comprising:
a second read circuit coupled to receive the complementary data output from the first and second storage devices of the 1-bit twin cell selected for read.

* * * * *